(12) United States Patent
Seo et al.

(10) Patent No.: US 11,393,551 B2
(45) Date of Patent: Jul. 19, 2022

(54) MEMORY CONTROLLER, MEMORY DEVICE, AND STORAGE DEVICE

(71) Applicant: SAMSUNG ELECTRONICS CO., LTD., Suwon-si (KR)

(72) Inventors: Youngdeok Seo, Seoul (KR); Woohyun Kang, Hwaseong-si (KR); Jinyoung Kim, Seoul (KR); Kangho Roh, Seoul (KR); Sehwan Park, Yongin-si (KR); Ilhan Park, Suwon-si (KR); Heetai Oh, Seoul (KR); Heewon Lee, Seoul (KR); Silwan Chang, Suwon-si (KR); Sanghyun Choi, Seoul (KR)

(73) Assignee: Samsung Electronics Co., Ltd., Suwon-si (KR)

(*) Notice: Subject to any disclaimer, the term of this patent is extended or adjusted under 35 U.S.C. 154(b) by 0 days.

(21) Appl. No.: 17/376,932

(22) Filed: Jul. 15, 2021

(65) Prior Publication Data

US 2022/0189575 A1  Jun. 16, 2022

(30) Foreign Application Priority Data

Dec. 16, 2020  (KR) .................... 10-2020-0176129

(51) Int. Cl.
   *G11C 29/42*   (2006.01)
   *G11C 29/44*   (2006.01)
   (Continued)

(52) U.S. Cl.
   CPC ........... *G11C 29/42* (2013.01); *G06N 20/00* (2019.01); *G11C 7/109* (2013.01); *G11C 7/1039* (2013.01);
   (Continued)

(58) Field of Classification Search
   CPC ..... G11C 29/42; G11C 7/1039; G11C 7/1063; G11C 7/109; G11C 29/4401
   See application file for complete search history.

(56) References Cited

U.S. PATENT DOCUMENTS 8,576,624 B2  11/2013  Dutta et al.
9,710,325 B2   7/2017  Chen et al.
(Continued)

FOREIGN PATENT DOCUMENTS

KR  1020160005264 A  1/2016
KR  1020170097267 A  8/2017

*Primary Examiner* — Han Yang
(74) *Attorney, Agent, or Firm* — Volentine, Whitt & Francos, PLLC

(57) ABSTRACT

A memory device may determine cell count information from a threshold voltage distribution of memory cells and may determine a detection case based on cell count information when correction of an error in read data, received from the memory device performing a read operation, fails. The memory controller may control the memory device to perform a read operation using a development time determined in consideration of an offset voltage of a read voltage corresponding to the detection case. When correction of the error in the read data fails again, the memory controller may control the memory device to perform a read operation using a corrected read voltage generated using a dynamic offset voltage obtained by inputting the cell count information to a machine learning model.

20 Claims, 23 Drawing Sheets

(51) Int. Cl.
*G11C 29/12* (2006.01)
*G06N 20/00* (2019.01)
*G11C 7/10* (2006.01)

(52) U.S. Cl.
CPC ...... *G11C 7/1063* (2013.01); *G11C 29/12005* (2013.01); *G11C 29/4401* (2013.01)

(56) References Cited

U.S. PATENT DOCUMENTS

| | | |
|---|---|---|
| 2015/0131376 A1 | 5/2015 | Tsang et al. |
| 2016/0004437 A1 | 1/2016 | Kim et al. |
| 2016/0132256 A1* | 5/2016 | Jung ...................... G06F 12/00 711/103 |
| 2017/0235633 A1 | 8/2017 | Park |
| 2019/0087119 A1 | 3/2019 | Oh et al. |
| 2019/0287629 A1* | 9/2019 | Bang ................... G06F 11/1068 |

* cited by examiner

| | | OVS Detection Cases | | | | |
|---|---|---|---|---|---|---|
| | | C1 | C2 | C3 | C4 | C5 |
| State offset | RP1 | −40 mV | −32 mV | 0 mV | 32 mV | 40 mV |
| | RP2 | −30 mV | −24 mV | 0 mV | 24 mV | 30 mV |
| | RP3 | −20 mV | −16 mV | 0 mV | 16 mV | 20 mV |
| | RP4 | −40 mV | −32 mV | 0 mV | 32 mV | 40 mV |
| | RP5 | −60 mV | −48 mV | 0 mV | 48 mV | 60 mV |
| | RP6 | −80 mV | −64 mV | 0 mV | 64 mV | 80 mV |
| | RP7 | −100 mV | −80 mV | 0 mV | 80 mV | 100 mV |

MEMORY CONTROLLER, MEMORY DEVICE, AND STORAGE DEVICE

CROSS-REFERENCE TO RELATED APPLICATION(S)

This application claims benefit of priority to Korean Patent Application No. 10-2020-0176129 filed on Dec. 16, 2020, in the Korean Intellectual Property Office, the disclosure of which is incorporated herein by reference in its entirety.

BACKGROUND

The present disclosure relates to a memory controller, a memory device, and a storage device.

A memory device may provide a function of writing and erasing data or reading written data. The memory device may perform a program operation, an erase operation, a read operation, and the like, in response to control signals transmitted by a memory controller and data obtained by the memory device in the read operation may be output to the memory controller. The memory controller may correct an error in data obtained as a result of the read operation and may instruct the memory device to perform an additional read operation when correction of the error fails.

SUMMARY

Example embodiments provide a memory controller, a memory device, and a storage device which may secure reliability of a read operation while significantly reducing time required for the read operation.

According to an example embodiment, a memory controller includes: control pins connected to at least one memory device and providing control signals to the memory device; data pins connected to the memory device and configured to transmit and receive a data signal to and from the memory device; a buffer memory configured to store a table, in which a static offset voltage for a read voltage is written, and a machine learning model receiving cell count information, indicating a threshold voltage valley of memory cells included in the memory device, and outputting a dynamic offset voltage for the read operation; an error correction circuit configured to correct an error in read data obtained from the memory device; and a processor configured to control the memory device to perform an optimal read operation obtaining read data by adjusting an operating condition of an read operation when the error correction circuit fails to correct the error in the read data. When the error correction circuit fails to correct an error in read data obtained by the optimal read operation, the processor obtains the dynamic offset voltage using the cell count information generated during the optimal read operation and transmits a corrected read voltage, reflecting the dynamic offset voltage, to the memory device.

According to an example embodiment, a storage device includes: at least one memory device; and a memory controller connected to the memory device by control pins providing at least one of a command latch enable (CLE) signal, an address latch enable (ALE) signal, a chip enable (CE) signal, a read enable (RE) signal, and a DQS signal, and data pins transmitting and receiving a data signal to and from the memory device and configured to store a table, in which a static offset voltage for a read voltage is written, and a machine learning model determining a dynamic offset voltage for a read voltage. When an error in first read data, output by the memory device performing a first read operation, is not corrected, the memory controller controls the memory device to perform a second read operation including an on-chip valley search operation. When an error in a second read voltage, output by the memory device performing a second read operation, is not corrected, a corrected read voltage, reflecting a dynamic offset voltage obtained by inputting at least a portion of detection information generated by the on-chip valley search operation to the machine learning model.

According to an example embodiment, a memory device includes: an input/output interface including a plurality of control pins, receiving control signals from a memory controller, and a plurality of data pins, transmitting and receiving a data signal to and from the memory controller and configured to receive at least one of a first read command and a second read command from the memory controller; a memory cell array having a plurality of memory cells; and a logic circuit configured to output read data, obtained from selected memory cells among the plurality of memory cells, to the memory controller in response to the first read command and the second read command. The logic circuit outputs cell count information, indicating a threshold voltage distribution of a plurality of states that the memory cells have, and a detection case, determined based on the cell count information, to the memory controller when receiving the second read command. When the first read command for the selected memory cells is re-received from the memory controller after the count information is output, a read operation is performed using a read voltage included in the re-received first read command and the read data is output to the memory controller.

According to an example embodiment, a method of controlling a memory device includes: transmitting a first read command, including a read voltage having a default level, to a memory device; transmitting a second read command to the memory device to perform an on-chip valley search operation to generate cell count information, to determine a detection case based on the cell count information, and to control the memory device to perform a read operation depending on the detection case; and transmitting the first read command, including a corrected read voltage reflecting a dynamic offset voltage obtained by inputting the cell count information to a pre-trained machine learning model, to the memory device when correction of an error in read data, received from the memory device in response to the second read command, fails.

BRIEF DESCRIPTION OF DRAWINGS

The above and other aspects, features, and advantages of the present disclosure will be more clearly understood from the following detailed description, taken in conjunction with the accompanying drawings.

DETAILED DESCRIPTION

Hereinafter, example embodiments will be described with reference to the accompanying drawings.

Figure 1:
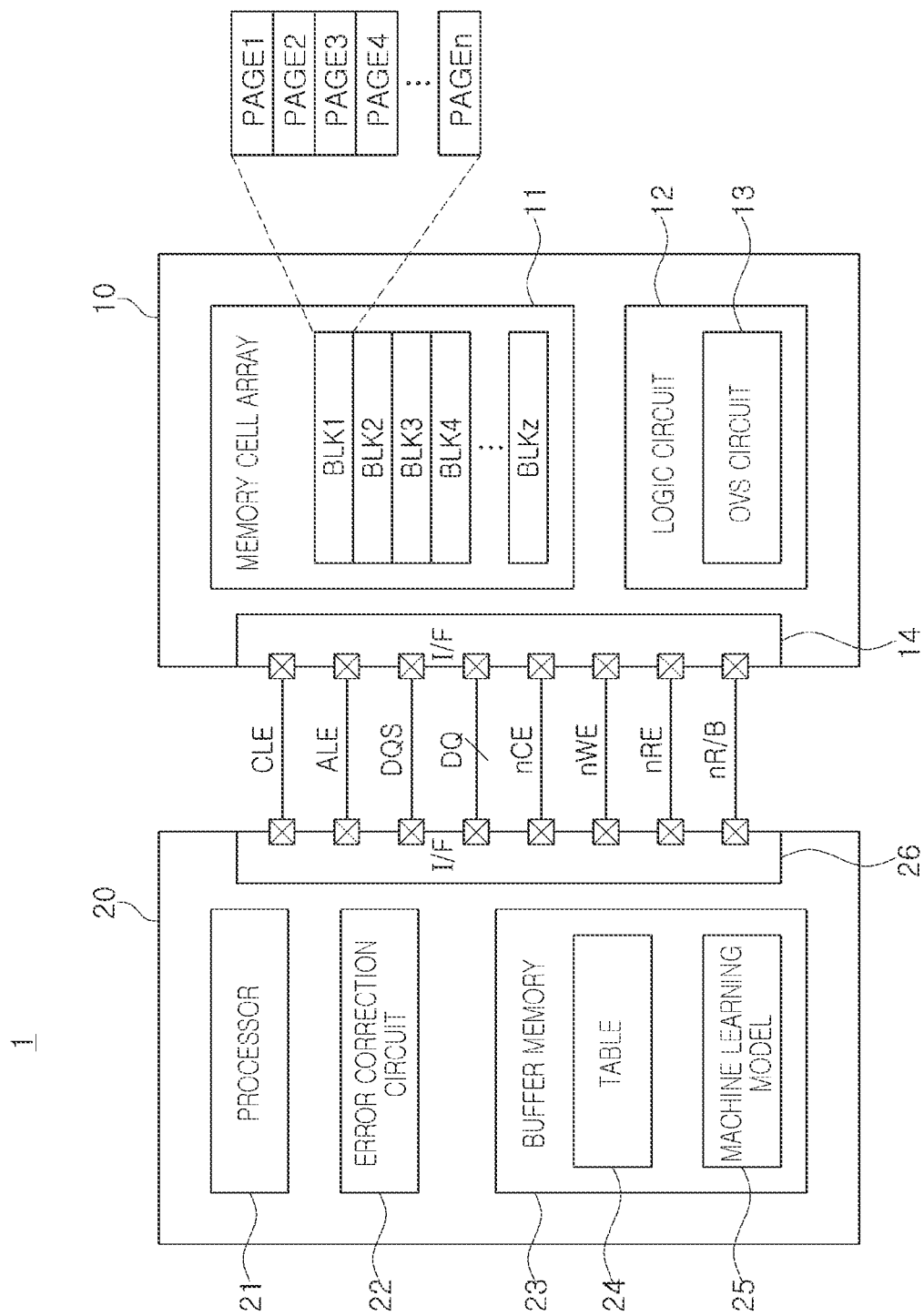
FIG. 1 is a schematic view of a storage device including a memory controller and a memory device according to example embodiments.

FIG. 1 is a schematic view of a storage device including a memory controller and a memory device according to example embodiments.

Referring to FIG. 1, a storage device 1 according to example embodiments may include at least one memory device 10, a memory controller 20, and the like. The memory device 10 may be implemented to store data. The memory device 10 may include a NAND flash memory, a vertical NAND flash memory, a NOR flash memory, a resistive random access memory (RRAM), a phase-change random access memory (PRAM), a magnetoresistive random access memory (MRAM), a ferroelectric random access memory (FRAM), a spin transfer torque random access memory (STT-RAM), or the like. In addition, the memory device 10 may be implemented to have a three-dimensional array structure.

The memory device 10 may include a memory cell array 11, a logic circuit 12, a memory interface 14, and the like. The memory cell array 11 may include a plurality of memory blocks BLK1 to BLKz. Each of the plurality of memory blocks BLK1 to BLKz may include a plurality of pages PAGE1 to PAGEn, and a plurality of memory cells may be included in each of the plurality of pages PAGE1 to PAGEn. Each of the plurality of memory cells may store one or more bits. For example, two or more bits of data may be stored in a single memory cell.

The logic circuit 12 may control the memory cell array 11 in response to control signals received from the memory controller 20 through a memory interface 14. As an example, the logic circuit 12 may exchange control signals with the memory controller 20 when a chip enable signal nCE is in an enable state. The logic circuit 12 may obtain a command signal and an address signal, included in a data signal DQ, during an enable period of a command latch enable signal CLE and an address latch enable signal ALE. As an example, the logic circuit 12 may obtain a command signal and/or an address signal from the data signal DQ at a toggle timing of a read enable signal nRE and a write enable signal nWE. The logic circuit 12 may perform a read operation, a program operation, an erase operation, and the like, based on the command signal and the address signal.

The logic circuit 12 may output read data as the data signal DQ in synchronization with a data strobe signal DQS or may obtain write data included in the data signal DQ in synchronization with the data strobe signal DQS. As an example, before outputting read data, the logic circuit 12 or the memory interface 14 may generate the data strobe signal DQS based on the read enable signal nRE. The memory interface 14 may output read data through the data signal DQ synchronized with the data strobe signal DQS. In addition, the logic circuit may transmit a state of the memory device 10 to the memory controller 20 using a ready/busy signal nR/B.

In addition, the logic circuit 12 may include an on-chip valley search (OVS) circuit 13. The OVS circuit 13 may perform an on-chip valley search operation. The on-chip valley search operation may include a first sensing operation, in which a detection case is determined based on a cell count, and a second sensing operation in which data is read from selected memory cells by changing development time and/or a level of a read voltage depending on the detection case determined in the first sensing operation. Detailed descriptions of the on-chip valley search operation will be understood with reference to KR 10-2019-0025359, US 2020-0098436, U.S. Pat. Nos. 10,090,046, 10,559,362, 10,607,708, and 10,629,259, which are incorporated herein by reference.

The memory controller 20 may include a processor 21, an error correction circuit 22, a buffer memory 23, a controller interface 26, and the like. The processor 21 may control all operations of the memory controller 20 and may generate a command signal, an address signal, and the like, for controlling the memory device 10. The controller interface 26 may be connected to the memory interface 14 through control pins and data pins. Control signals such as the command latch enable signal CLE, the address latch enable signal ALE, the data strobe signal DQS, the chip enable signal nCE, the read enable signal nRE, the write enable signal nWE, and the ready/busy signals nR/B may be transmitted through the control pins, and the data signal DQ may be transmitted through data pins.

The error correction circuit 22 may generate an error correction code in a program operation and may correct an error in read data, received from the memory device 10, using the error correction code in a read operation. The error correction circuit 22 may correct an error using a coded modulation such as a low density parity check (LDPC) code, a BCH code, a turbo code, a Reed-Solomon code, a convolution code, a recursive systematic code (RSC), a trellis-coded modulation (TCM), a block coded modulation (BCM).

The buffer memory 23 may store a table 24 and a machine learning model 25. As an example, the table 24 may include first to third tables. The first table may be a table in which a first static offset voltage is written. The first static offset voltage may be classified into various types of degradation data including a time elapsed after a program operation, for example, an operation temperature, a program/erase cycle, a read cycle, an open wordline case, and the like, and then written in the first table.

The second table may be a table in which the second static offset voltage is written after matching the detection case determined by performing the OVS operation by the memory device 10. When the memory controller 20 receives the detection case, a result of the OVS operation from the memory device 10, the processor 21 may determine the second static offset voltage based on the received detection case and the second table.

The third table may be a table in which a third static offset voltage associated with a history read operation is written. In an example embodiment, the third static offset voltage may be determined by the first static offset voltage and the second static offset voltage. The third static offset voltage may include data on an optimal read level of a read voltage for the history read operation. Details of the history read operation will be understood with reference to U.S. Pat. Nos. 10,120,589 and 10,373,693, which are incorporated herein by reference.

When an error in the read data, obtained from the memory device 10 as a result of the read operation, is not corrected by the error correction circuit 22, the memory controller 20 may instruct a read operation to the memory device 10 again. In this case, the read operation, instructed to the memory device 10 by the memory controller 20, may be an optimized read operation in which the memory device 10 adjusts an operating condition of the read operation to obtain and output read data. The operating condition of the read operation, adjusted in the optimized read operation, may be a development time or a level of the read voltage. As an example, the optimized read operation may be an OVS read operation including a first sensing operation, in which the memory device 10 obtains cell count information and determines a detection case based on the cell count information, and a second sensing operation in which a read operation is performed depending on the detection case determined in the first sensing operation and read data is generated.

The memory controller 20 may receive cell count information generated in the first sensing operation and a detection case determined based on the cell count information, as detection information, together with read data generated in the second sensing operation. According to example embodiments, the detection information may include development time information corresponding to the detection case. The cell count information may include the number of memory cells turned on or off depending on to the level of the read voltage and/or the development time. When an error in the read data generated by the second sensing operation is corrected by the error correction circuit 22, the processor 21 may update the third static offset voltage, written in the third table, based on the detection case and the second table.

On the other hand, when the error in the read data generated by the second sensing operation is not corrected by the error correction circuit 22, the processor 21 may input cell count information to the machine learning model 25. The machine learning model 25 may be a model trained to receive cell count information, indicating a threshold voltage distribution of memory cells, or the like, and to output an optimized static offset voltage. The processor 21 may correct the read voltage using the dynamic offset voltage and may instruct the memory device 10 to re-perform the read operation using the corrected read voltage.

In an example embodiment, when an error in read data obtained by a normal read operation is not corrected, the memory controller 20 may control the memory device 10 to perform an optimized read operation in which operating conditions of the read operation are adjusted to obtain read data. When an error in the read data obtained by the optimized read operation is also not corrected, the memory controller 20 may input the cell count information, included in the detection information received as a result of the optimized read operation, to the machine learning model 25 to generate a dynamic offset voltage. The memory controller 20 may control the memory device 10 to perform a read operation using a corrected read voltage generated by reflecting the dynamic offset voltage.

In an example embodiment, the machine learning model 25 may be used when an error in read data is not corrected by an optimized read operation. Thus, reliability of the read operation may be improved. In addition, since the machine learning model 25 generates a dynamic offset voltage using the cell count information generated in an optimization operation, it is unnecessary to additionally collect information indicating a threshold voltage distribution of the memory cells so as to generate the dynamic offset voltage. Therefore, an increase in time required for a read operation may be significantly reduced and latency of the read operation may be improved.

Figure 2:
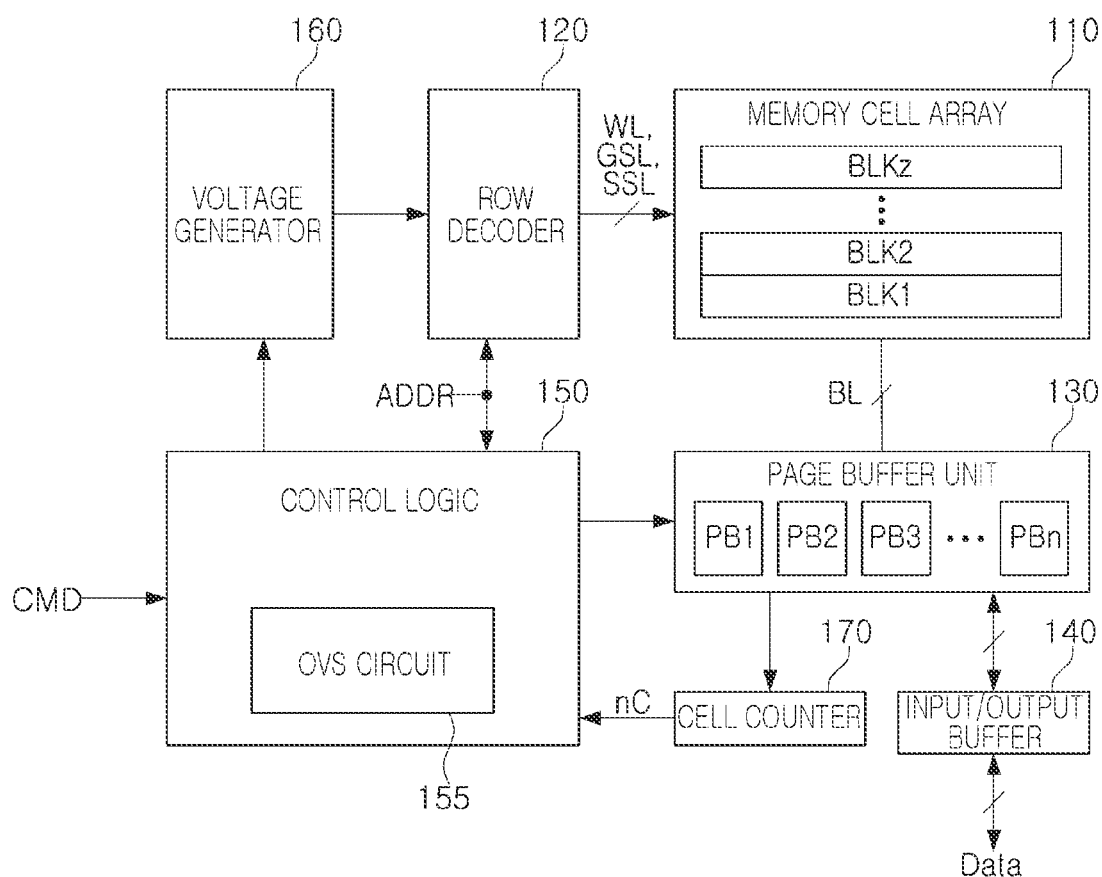
FIG. 2 is a schematic view of a memory device according to example embodiments.

FIG. 2 is a schematic view of a memory device according to example embodiments.

Referring to FIG. 2, a memory device 100 may include a memory cell array 110, a row decoder 120, a page buffer unit 130, an input/output buffer 140, a control logic 150, a voltage generator 160, a cell counter 170, and the like.

The memory cell array 110 may be connected to the row decoder 120 through wordlines WL or selected lines SSL and GSL. The memory cell array 110 may be connected to the page buffer unit 130 through bitlines BL. The memory cell array 110 may include a plurality of cell strings. A channel of each of the cell strings may be formed in a vertical or horizontal direction, and each of the cell strings may include a plurality of memory cells. In the memory cell array 110, cell strings may be divided into a plurality of memory blocks BLK1 to BLKz.

The row decoder 120 may select at least one of the memory cells of the memory cell array 110 in response to an address ADDR. The row decoder 120 may select at least one of the wordlines WL in response to the address ADDR. The row decoder 120 may transmit a bias voltage for performing a program operation, a read operation, an erase operation, or the like, to a selected wordline among the wordlines WL. During the program operation, the row decoder 120 may apply a program voltage and a verify voltage to a selected wordline and may apply a pass voltage to unselected wordlines. During the read operation, the row decoder 120 may apply a read voltage to a selected wordline and may apply a read pass voltage to unselected wordlines.

The page buffer unit 130 may operate as a write driver or a sense amplifier. During the program operation, the page buffer circuit 130 may apply a bitline voltage, corresponding to data to be programmed, to a selected bitline among the bitlines BL of the memory cell array 110. During the read operation or the verify operation, the page buffer unit 130 may detect data, stored in a selected memory cell, through a selected bitline. Each of the plurality of page buffers PB1 to PBn, included in the page buffer unit 130, may be connected to at least one bitline.

Each of the plurality of page buffers PB1 to PBn may be implemented to perform an OVS operation. Each of the memory cells may have one state, among a plurality of states, according to written data, and the plurality of states may be defined based on a threshold voltage of each of the memory cells. Each of the plurality of page buffers PB1 to PBn may perform a plurality of sensing operations to identify states of selected memory cells under the control of the control logic 150. In addition, each of the plurality of page buffers PB1 to PBn may store data sensed through a plurality of sensing operations and then may select a certain piece of data under the control of the control logic 150. For example, each of the plurality of page buffers PB1 to PBn may perform a sensing operation two or more times. In addition, each of the plurality of page buffers PB1 to PBn may select or output optimal data, among a plurality of pieces of data sensed according to the control of the control logic 150.

The input/output buffer 140 may provide externally provided data (Data) to the page buffer unit 130. In addition, the input/output buffer 140 may provide an externally provided command CMD to the control logic 150. The input/output buffer 140 may provide an externally provided address ADDR to the control logic 150 and/or the row decoder 120. In addition, the input/output buffer 140 may output data, sensed and latched by the page buffer unit 130, to an external entity.

The control logic 150 may control the row decoder 120, the page buffer unit 130, the voltage generator 160, and the like, in response to an externally transmitted command CMD. In addition, the control logic 150 may include an OVS circuit 155 performing an OVS operation. The OVS circuit 155 may control the page buffer unit 130 and the voltage generator 160 for the OVS operation. The OVS circuit 155 may control the page buffer unit 130 to perform a plurality of sensing operations to identify specific states of selected memory cells. In addition, the OVS circuit 155 may store sensing data, corresponding to each of the plurality of sensing results, in a plurality of latch sets respectively provided in the plurality of page buffers PB1 to PBn.

In addition, the OVS circuit 155 may store detection information generated by the OVS operation. The detection information may include cell count information nC, generated in the OVS operation, and a detection case determined based on the cell count information nC. The OVS circuit 155 may output the detection information to an external memory controller. According to example embodiments, the detection information may be output using a universal internal bus (UIB) OUT or may be output in response to a special command transmitted from the memory controller, for example, a get feature command or a status read command. The detection information may be stored in the memory controller to be used to update a table determining a level of a read voltage.

The cell counter 170 may be implemented to count memory cells, each having a threshold voltage in a specific range, from sensed data in the page buffer unit 130. For example, the cell counter 170 may process sensed data in each of the page buffers PB1 to PBn to count the number of memory cells, each having a threshold voltage in a specific range. In an example embodiment, the cell count information nC output by the cell counter 170 may be used as input data in order for the memory controller to obtain a dynamic offset voltage from a machine learning model.

Figure 3:
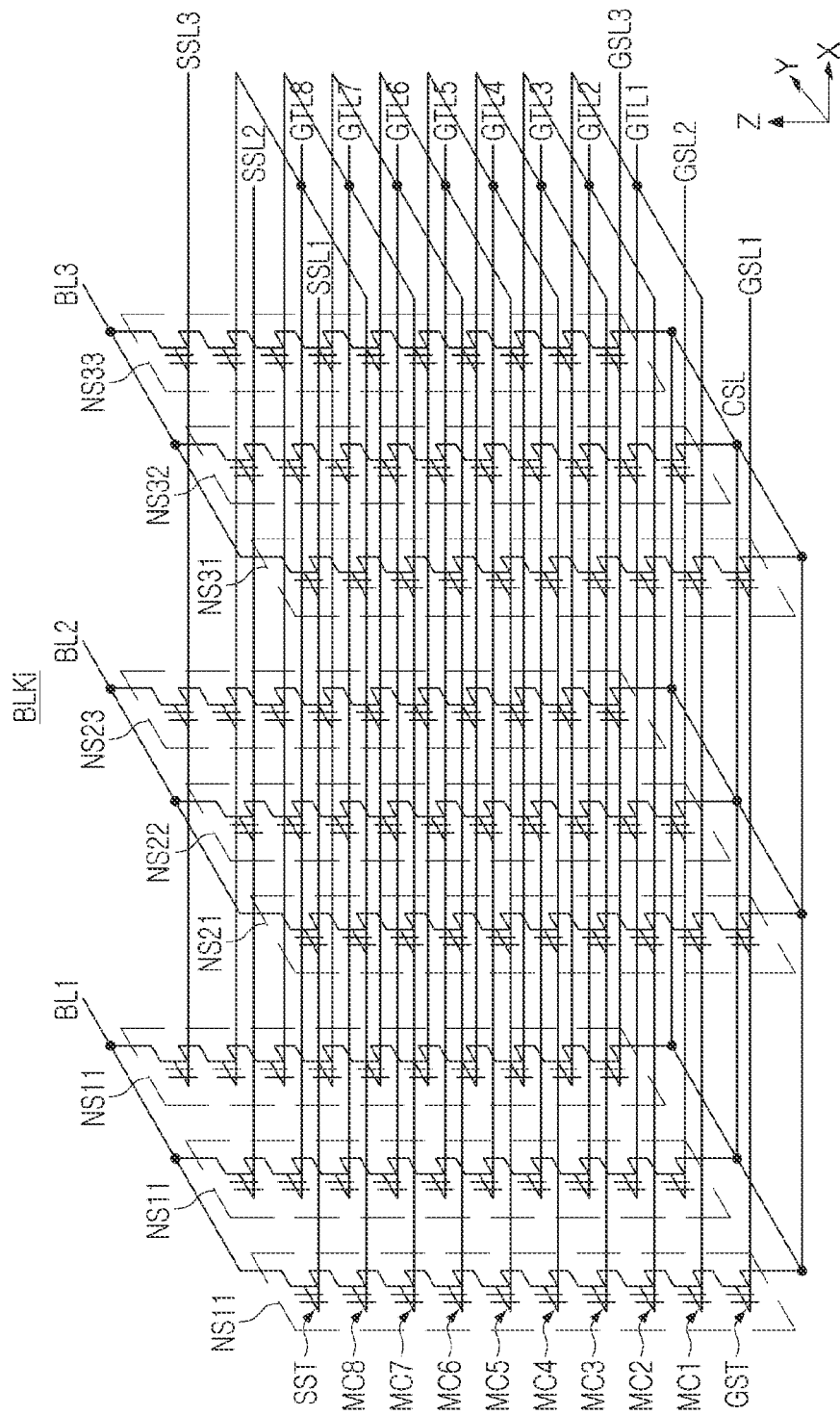
FIG. 3 is a circuit diagram of a memory cell array including a memory device according to example embodiments.

FIG. 3 is a circuit diagram of a memory cell array including a memory device according to example embodiments.

FIG. 3 is a diagram illustrating a 3D V-NAND structure which may be applied to a memory device of a memory system according to example embodiments. When the memory device is implemented as a 3D V-NAND type flash memory, each of a plurality of memory blocks included in the memory cell array may be represented by an equivalent circuit as illustrated in FIG. 3.

A memory block BLKi illustrated in FIG. 3 represents a three-dimensional memory block formed on a substrate in a three-dimensional structure. For example, a plurality of memory NAND strings included in the memory block BLKi may be formed in a direction, perpendicular to the substrate.

Figure 8:
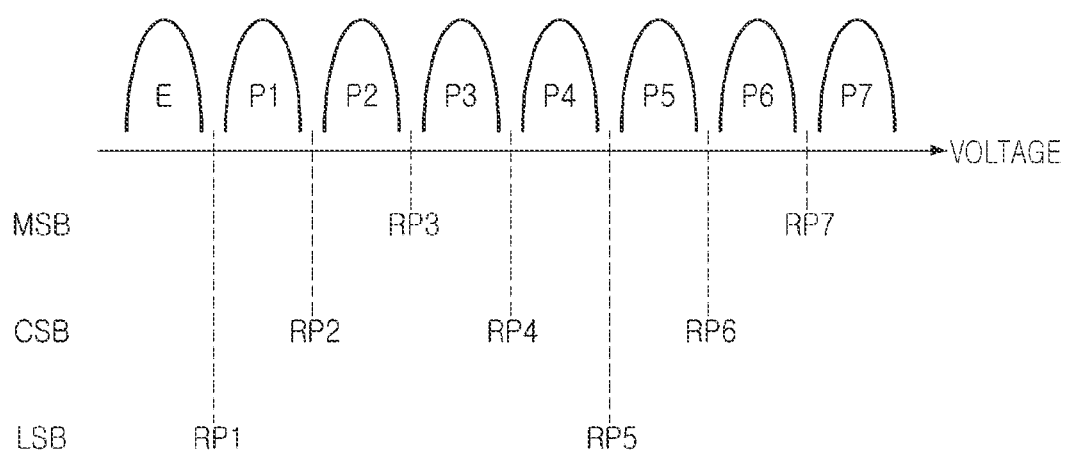
FIGS. 8 and 9 are diagrams illustrating an operation of a memory device according to example embodiments.

Referring to FIG. 3, the memory block BLKi may include a plurality of memory NAND strings NS11 to NS33 connected between bitlines BL1, BL2, and BL3 and a common source line CSL. Each of the plurality of memory NAND strings NS11 to NS33 may include a string select transistor SST, a plurality of memory cells MC1, MC2, ..., and MC8, and a ground select transistor GST. In FIG. 8, each of the plurality of memory NAND strings NS11 to NS33 is illustrated as including eight memory cells MC1, MC2, ..., and MC8, but example embodiments are not limited thereto.

The string selection transistor SST may be connected to the corresponding string selection lines SSL1, SSL2, and SSL3. The plurality of memory cells MC1, MC2, ..., and MC8 may be connected to corresponding gate lines GTL1, GTL2, ..., and GTL8, respectively. The gate lines GTL1, GTL2, ..., and GTL8 may correspond to wordlines, and some of the gate lines GTL1, GTL2, ..., and GTL8 may correspond to dummy wordlines. The ground select transistor GST may be connected to corresponding ground select lines GSL1, GSL2, and GSL3. The string select transistor SST may be connected to corresponding bitlines BL1, BL2, and BL3, and the ground select transistor GST may be connected to the common source line CSL.

Wordlines (for example, WL1) having the same height may be connected in common, and the ground select lines GSL1, GSL2, and GSL3 and the string select lines SSL1, SSL2, and SSL3 may be separated from each other. In FIG. 3, the memory block BLKi is illustrated as being connected to the eight gate lines GTL1, GTL2, ..., and GTL8 and the three bitlines BL1, BL2, and BL3, but example embodiments are not limited thereto.

Figure 4:
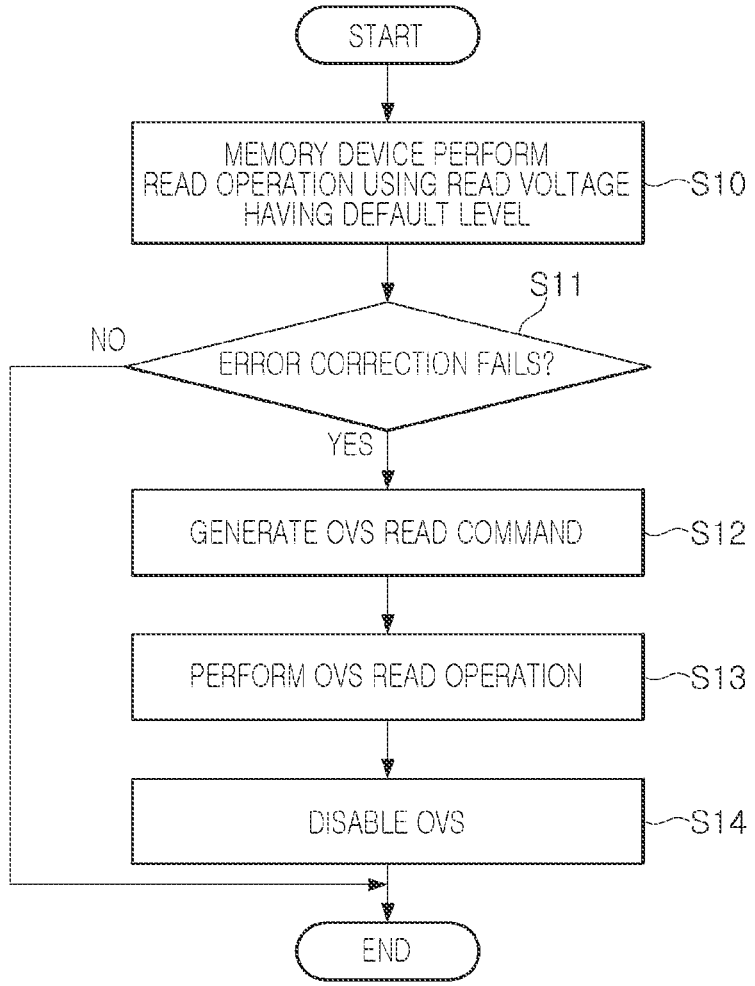
FIG. 4 is a flowchart illustrating a comparative example for describing an operation of a memory controller according to example embodiments.

FIG. 4 is a flowchart illustrating a comparative example for describing an operation of a memory controller according to example embodiments.

Referring to FIG. 4, in the comparative example, a memory controller included in a storage device may control a memory device to perform a read operation using a read voltage having a default level (S10). In operation S10, the memory controller may generate a read command including a read voltage having a predetermined default level and may transmit the read command to the memory device. The memory device may perform a read operation using the read voltage of the predetermined default level included in the read command as it is.

When the memory device completes the read operation and transmits read data to the memory controller, the memory controller may correct an error in the read data (S11). As described above, the error correction circuit may correct the error in the read data and may complete the read operation without an additional operation when error correction is successful in operation S11 or no error is found.

Meanwhile, when the error correction circuit fails to correct the error, the memory controller may generate an OVS read command (S12). The memory device receiving the OVS read command may perform an OVS read operation (S13). In the OVS read operation, the memory device searches for an optimal detection case depending on a threshold voltage distribution of memory cells using the OVS circuit, as described above, and may perform a read operation in such a manner of adjusting a development time in consideration of an offset voltage which should be reflected in a read voltage depending on the optimal detection case. When the OVS read operation is completed, the OVS operation is disabled in the memory device (S14) and the read operation may be completed.

As described above, in the comparative example, when correction of an error in read data generated in the general read operation fails, an OVS read operation may be performed using an OVS circuit mounted in a memory device. Accordingly, error-corrected read data or read data having an error correctable by an error correction circuit may be rapidly read. However, when an error is not corrected even in the read data generated by the OVS read operation, the read operation may fail. In addition, even in the case in which the read operation is successfully performed using the OVS read operation, the OVS operation is disabled when a read operation starts to be performed on a next address, so correction of the error in the read data may fail again and the OVS operation may be re-performed to increase latency of the read operation.

In an example embodiment, when read data having an error correctable by an OVS read operation or read data having no error is obtained, a static offset voltage corresponding to an optimal detection case obtained in the OVS read operation may be reflected in a read voltage. Thus, a possibility of an error occurring in a read operation on a next address may be reduced.

In addition, when the error in the read data is not corrected even by the OVS read operation, cell count information obtained from the OVS read operation may be input to a machine learning model to generate a dynamic offset voltage for a read operation and the memory device may re-perform the read operation using a read voltage reflecting the dynamic offset voltage. Since the dynamic offset voltage is generated using the cell count information generated in the OVS read operation as it is without an additional information collection process for inferring the machine learning model, reliability of the read operation may be improved while significantly reducing an increase in latency.

Figure 5:
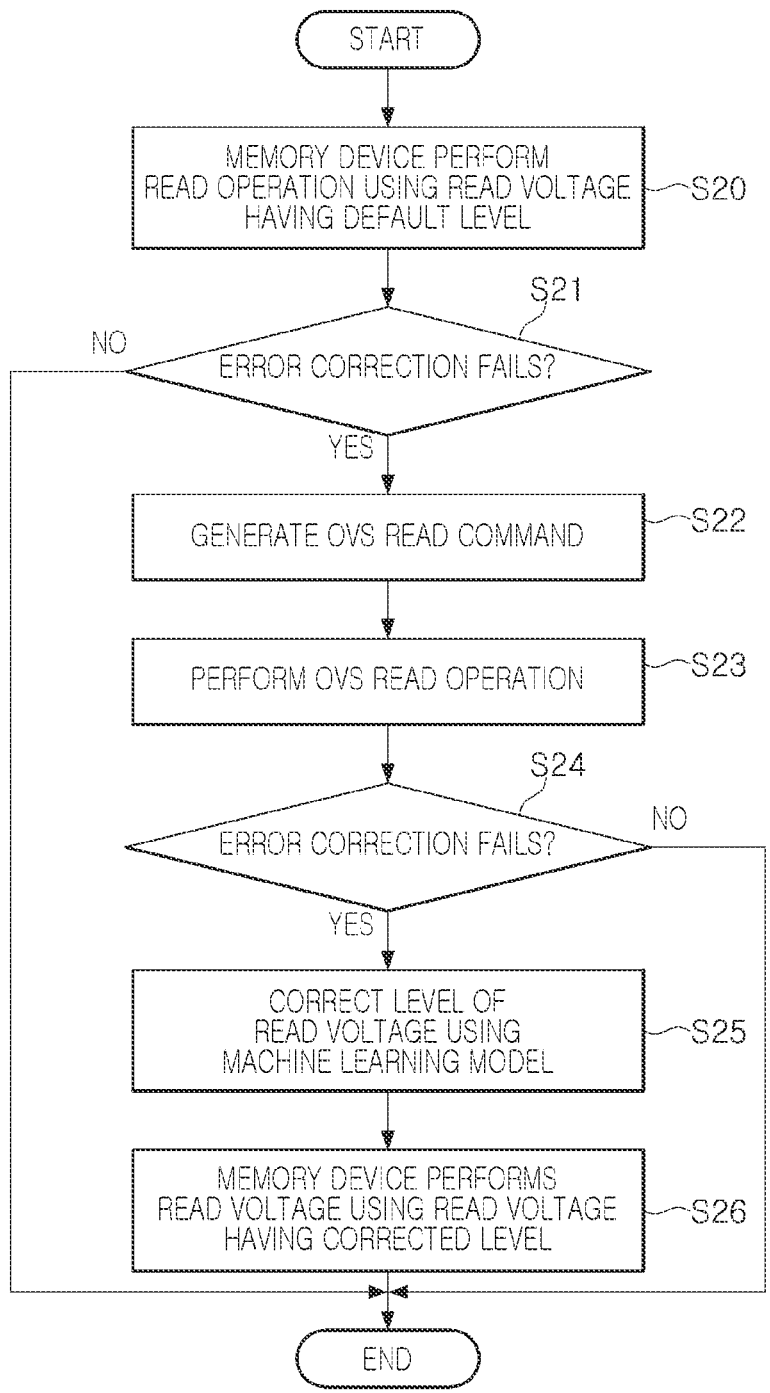
FIGS. 5 and 6 are flowcharts illustrating an operation of a memory controller according to example embodiments, respectively.
Figure 6:
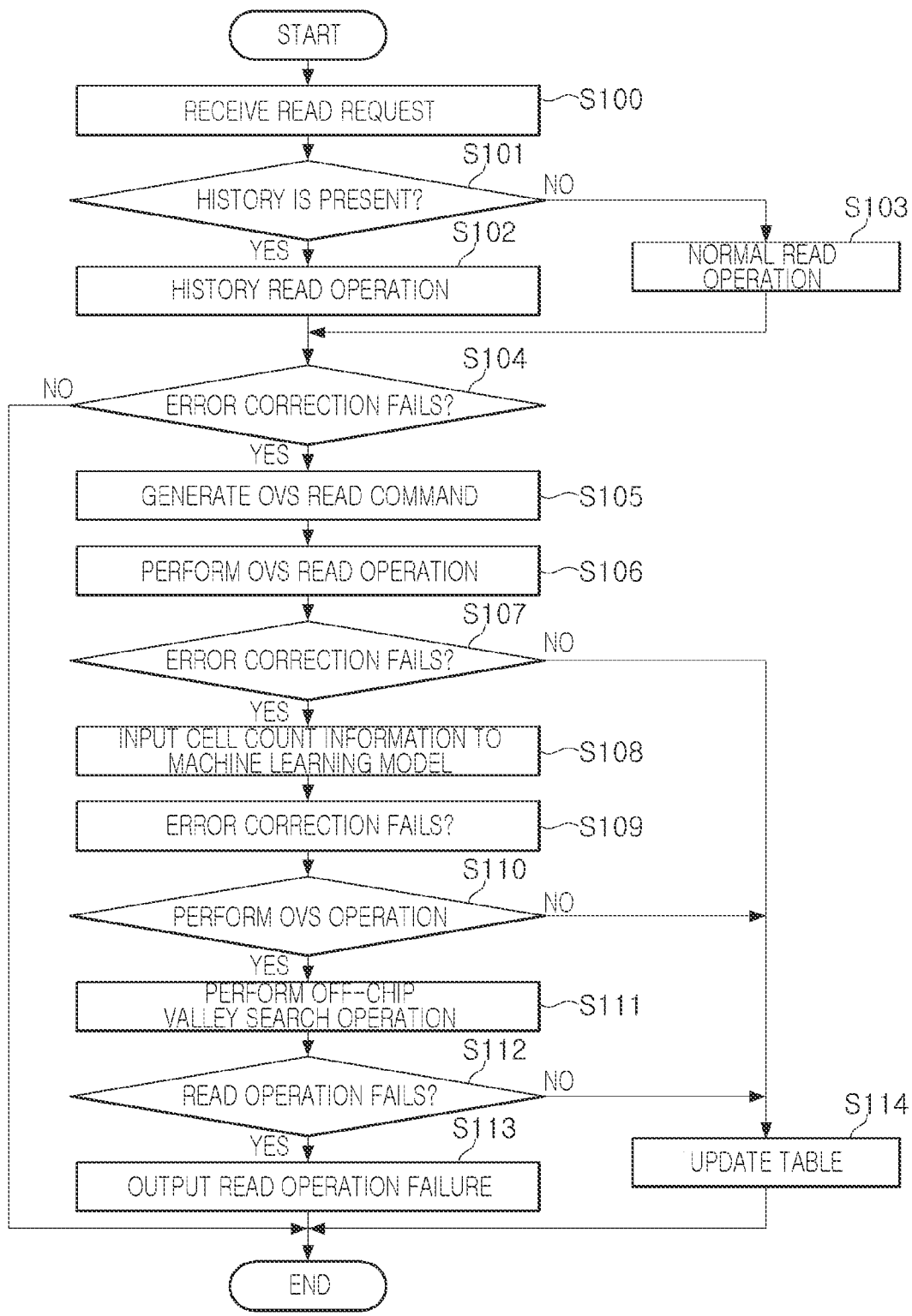

FIGS. 5 and 6 are flowcharts illustrating an operation of a memory controller according to example embodiments, respectively.

Referring to FIG. 5, an operation of a storage device according to example embodiments may start with an operation of controlling a memory device such that a memory controller performs a read operation using a read voltage having a default level (S20). The default level may be a predetermined level. According to example embodiment, the default level may be determined based on a level of a read voltage which succeeded in a previous read operation. When the read data is received from the memory device as a result of the read operation, an error correction circuit of the memory controller may check and correct an error in the read data (S21).

When the error correction circuit does not fail to correct the error in operation S21, for example, when an error is not detected in read data or when a detected error is successfully corrected, the read operation may be finished without an additional operation. Meanwhile, when the error correction circuit fails to correct the error in operation S21, the memory controller may generate an OVS read command (S22). The memory device, receiving the OVS read command, may be controlled to perform the OVS read operation (S23). The OVS read operation may include a first sensing operation, in which a cell count representing a threshold voltage distribution of memory cells is collected and a detection case is determined accordingly, and a second sensing operation in which a development time varies depending on a detection case determined in the first sensing operation to generate read data.

The memory controller may detect and correct an error in read data generated by the second sensing operation (S24). In addition, the memory controller may receive cell count information generated in the OVS read operation. When the error in the read data is not corrected in operation S24, the memory controller may correct a level of the read voltage using a machine learning model (S25). The machine learning model is a pre-trained model and may receive the cell count information received from the memory device to output a dynamic offset voltage for correcting an input voltage. The memory controller may correct the level of the read voltage using the dynamic offset voltage output from the machine learning model (S25) and may transmit a read command, including a read voltage having the corrected level, to the memory device. Accordingly, the memory device may perform a read operation using the read voltage having the corrected level (S26).

The read operation, performed by the memory device in operation S26, may be a normal read operation such as operation S20, rather than an OVS read operation. However, the memory device may perform a read operation using a corrected read voltage having an error adjusted by a dynamic offset voltage output from the machine learning model, and thus, the error in the read data may be cured or the error in the read data may be corrected by the error correction circuit.

Referring to FIG. 6, an operation of the storage device according to example embodiments may start with an operation in which a memory controller receives a read request (S100). As an example, the storage device may receive a read request from an external host and may generate a read command in response to the received read request. The memory controller may determine a level of a read voltage to generate a read command.

The memory controller may check a history of the read request received from the host to determine the level of the read voltage (S101). As an example, the memory controller may determine whether a previous read request corresponding to the read request received from the host is present in a buffer memory, or the like. When the previous read request corresponding to the currently received read request is present in the buffer memory, the memory controller may determine the level of the read voltage based on a history read level written in a table such as the buffer memory. Accordingly, the memory device may perform a history read operation (S102). Meanwhile, when the previous read request corresponding to the currently received read request is not present in the buffer memory, the memory controller may determine the level of the read voltage to be a default level, and the memory device may perform a normal read operation (S103).

The error correction circuit of the memory controller may perform an error correction operation on the read data received as a result of the read operation performed by operation S102 or S103 (S104). When the error of the read data is successfully corrected in operation S104 or when no error is detected in the read data, the read operation may be finished without an additional operation. Meanwhile, when the error of the read data is not corrected in operation S104, the memory controller may generate an OVS read command (S105).

The memory device, receiving the OVS read command from the memory controller, may perform an OVS read operation (S106). As described above, in the OVS read operation, the memory device may collect cell count information, indicating a threshold voltage distribution of memory cells, to determine a detection case and may determine a development time depending on the detection case to generate read data. According to example embodiments, the memory device may generate cell count information and development time information as detection information of the OVS read operation. As an example, the memory device may output detection information to the memory controller in response to a special command received from the memory controller.

The error correction circuit of the memory controller may detect and correct an error in the read data received as a result of the OVS read operation (S107). When no error is detected or an error is successfully corrected in operation S107, the memory controller may update a table of the buffer memory based on development time information included in the detection information (S114).

As an example, the buffer memory may include a first table in which a first static offset voltage depending on degradation information of the memory cells is written, a second table in which a second static offset voltage depending on a detection case is written, and a third table in which a first static offset voltage determined by the first static offset voltage and the second static offset voltage is written. A processor of the memory controller may select a second static offset voltage matching the detection case included in the detection information and may update the third static offset voltage, written in the third table, using the second static offset voltage.

When error correction fails in operation S107, the process of the memory controller may input cell count information, included in the detection information, to a machine learning model (S108). The machine learning model may be a model included in a buffer memory, or the like, and may be a model pre-trained to output an optimal dynamic offset voltage by receiving address information, degradation information, and the like, of a selected memory cell to obtain cell count information and read data. The degradation information may include at least one of a time elapsed after a program operation, an operation temperature, a program/erase cycle, and a read cycle. The memory controller may reflect the dynamic offset voltage, obtained in operation S108, in the read voltage to generate a corrected read voltage and may transmit the corrected read voltage to the memory device. Accordingly, the memory device may perform a read operation using the corrected read voltage (S109).

The error correction circuit of the memory controller may detect and correct an error in the read data received as a result of the read operation in operation S109 (S110). When no error is detected or an error is successfully corrected in operation S110, the memory controller may update the third table using the dynamic offset voltage reflected in the correction read voltage (S114).

Meanwhile, when error correction fails in operation S110, the memory device may perform an off-chip valley search operation for data recovery (S111). For example, the off-chip valley search operation may be an operation in which a valley of a threshold voltage distribution is found by sequentially scanning a predetermined voltage range while increasing or decreasing by a predetermined level. A read operation may be re-performed using a read voltage having a level corresponding to the valley of the threshold voltage distribution found by the off-chip valley search operation, and the memory controller may determine whether the read operation is successful (S112). When the read operation is determined to be successful in operation S112, the memory controller may update a table (S114). Meanwhile, when that the read operation is determined to fail in operation S112, the memory controller may output a failure of the read operation to a host (S113).

Figure 7:
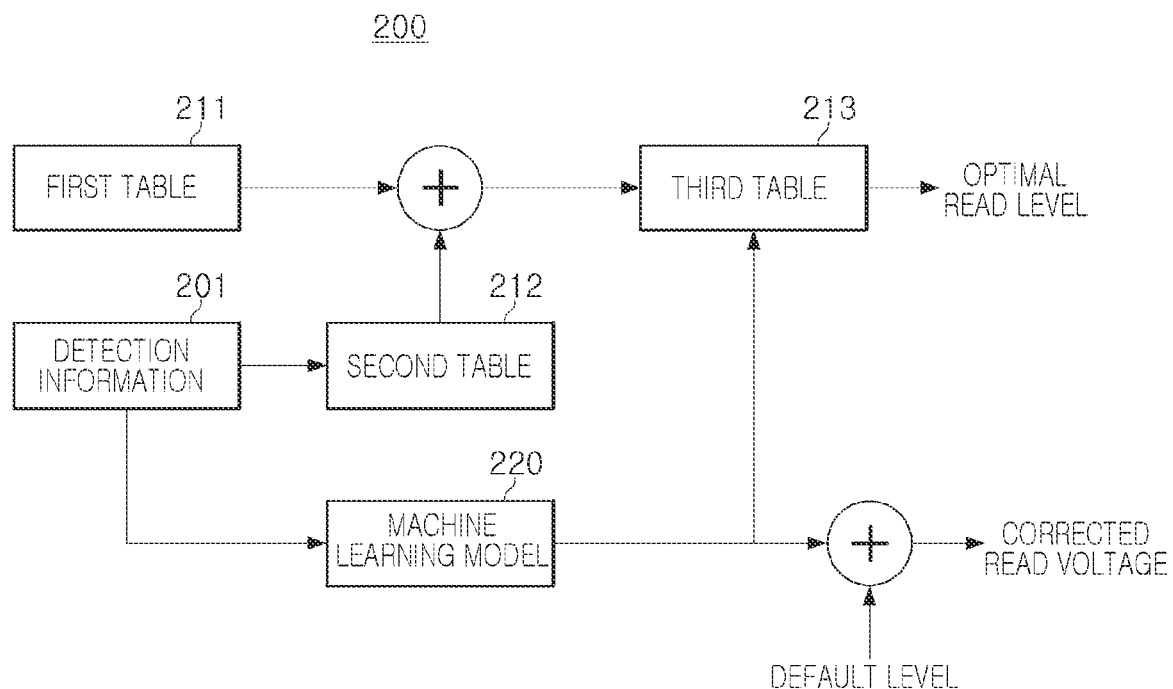
FIG. 7 is a diagram illustrating an operation of a memory controller according to example embodiments.

FIG. 7 is a diagram illustrating an operation of a memory controller according to example embodiments.

FIG. 7 may be a conceptual diagram illustrating a method of determining an optimal read level in a memory controller 200. Referring to FIG. 7, the memory controller 200 may determine an optimal read level using first to third tables 211 to 213, stored in a buffer memory or the like, and a machine learning model 220.

The first table 211 may be a table in which a first static offset voltage depending on degradation information such as a time elapsed after a program operation, an operation temperature, a program/erase operation cycle, and a read cycle is written. The second table 212 may be a table in which a second static offset voltage, matching a detection case in detection information 201 received from the memory device performing an OVS read operation, is written. The third table 213 may be a table in which a third static offset voltage, determined to be the sum of the first static offset voltage and the second static offset voltage, is written.

The third static offset voltage stored in the third table 213 may also be updated by an output of the machine learning model 220. As described above with reference to FIG. 6, the machine learning model 220 may receive cell count information in the detection information 201 to output a dynamic offset voltage. The third table 213 may be updated by a dynamic offset voltage output by the machine learning model 220. In addition, the dynamic offset voltage output by the machine learning model 220 may be added to a default level of a read voltage to determine a level of a corrected read voltage. When a read operation is successful by the OVS read operation and/or the read operation using the machine learning model 220, the memory controller may determine a level of a read voltage (e.g., an optimal read level) for a subsequent read operation based on the third static offset voltage written in the third table 213.

Figure 9:
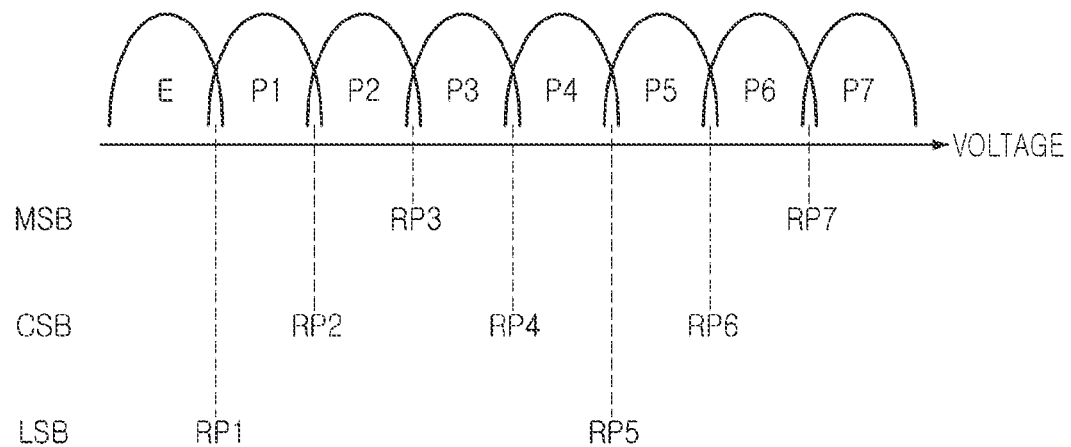

FIGS. 8 and 9 are diagrams illustrating an operation of a memory device according to example embodiments.

In the example embodiments illustrated in FIGS. 8 and 9, memory cells of a memory device may each be programmed in a triple level cell (TLC) manner in which three bits of data are stored per cell. Each of the memory cells may have one of eight states E to P7 depending on written data.

Referring to FIGS. 8 and 9, a read operation on each of the memory cells may be performed three times and eight-state information may be output after being divided into three pages. In an example embodiment, the erase state E may be assigned to data '111,' a first program state P1 may be assigned to data '110,' a second program state P2 may be assigned to data '100,' a third program state P3 may be assigned to data '000,' a fourth program state P4 may be assigned to data '010,' a fifth program state P5 may be assigned to data '011,' a sixth program state P6 may be assigned to data '001', and a seventh program state P7 may be assigned to '101.' However, this is only one embodiment, and data assigned to the states E to P7 of each of the memory cells may be changed in various embodiments.

As an example, a read operation of a least significant bit (LSB) may include a first read operation using a first read voltage RP1 between the erase state E and the first program state P1 and a second read operation using a fifth read voltage RP5 between the fourth program state P4 and the fifth program state P5. Similarly, a read operation of a most significant bit (MSB) may include a first read operation using a third read voltage RP3 between the second program state P2 and the third program state P3 and a second read operation using a seventh read voltage RP7 between the sixth program state P6 and the seventh program state P7. A read operation of an intermediate significant bit (CSB) may include a first read operation using a second read voltage RP2 between the first program state P1 and the second program state P2, a second read operation using a fourth read voltage RP4 between the third program state P3 and the fourth program state P4, and a third read operation using a sixth read voltage RP6 between the fifth program state P5 and the sixth program state P6.

An ideal threshold voltage distribution of the memory cells may be illustrated in FIG. 8. In this case, no error may be included in read data obtained from the memory cells using the read voltages RP1 to RP7 or an error may be corrected by an error correction circuit. However, as a time elapses after a program operation or as program/erase operations and a read operation are repeatedly performed, a threshold voltage distribution of the memory cells may be deteriorated as illustrated in FIG. 9.

Referring to FIG. 9, threshold voltage distributions may overlap each other in at least some of the states E to P7. In this case, when a read operation is performed using the read voltages RP1 to RP7 as they are, an error in read data may not be corrected by the error correction circuit. Accordingly, in an example embodiment, levels of the read voltages RP1 to RP7 may be corrected using detection information generated in an OVS read operation while controlling the memory device to perform the OVS read operation. As a result, reliability of the read operation may be improved.

Figure 10:
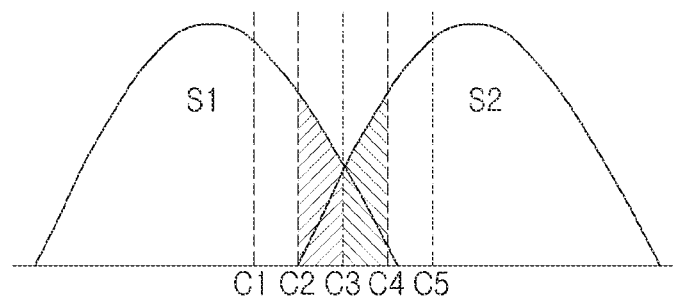
FIGS. 10 and 11 are diagrams illustrating an operation of a memory device according to example embodiments.
Figure 11:
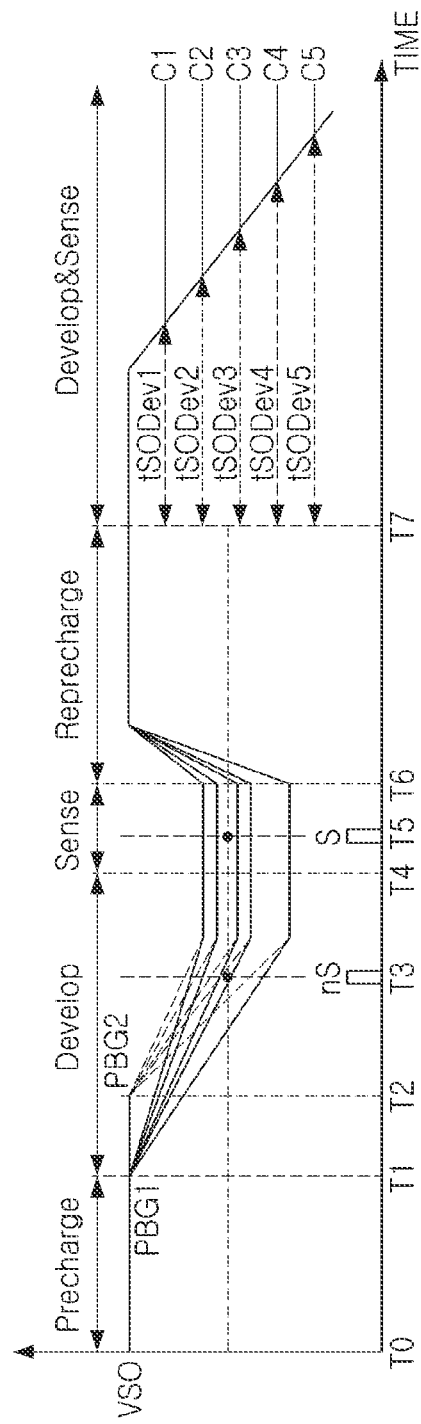

FIGS. 10 and 11 are diagrams illustrating an operation of a memory device according to example embodiments.

Referring to FIG. 10, threshold voltage distributions of respective states S1 and S2 of memory cells of a memory device may be deteriorated by various factors to overlap each other. When the threshold voltage distributions overlap each other, an error may be included in read data or an error in the read data may not be corrected by an error correction circuit. In an example embodiment, when correction of the error in the read data fails, the memory controller may generate an OVS read command and may then transmit the generated OVS read command to the memory device.

In response to the OVS read command, the memory device may perform an OVS read operation of finding an optimal valley in the threshold voltage distributions overlapping each other and generating read data. As an example, the OVS read operation may be performed in a manner of determining an optimal detection case based on cell count information obtained from the threshold voltage distribution and adjusting a development time in consideration of an offset voltage which should be reflected in a read voltage according to the optimal detection case. Hereinafter, the OVS read operation will be described with reference to FIG. 11.

Referring to FIG. 11, an OVS read operation may be performed using first page buffers PBG1 and second page buffers PBG2. A precharge operation may be performed from timing T0 to timing T1. A first bitline and a first sensing node, connected to each of first page buffers PBG1, may be charged in the precharge operation. For example, when bitline set-up signals are enabled, a sensing node and a first bitline may be precharged to a predetermined voltage level VSO. When a first bitline set-up signal is disabled at timing T1, the precharge circuit of each of the first page buffers PBG1 may be turned off. The precharge circuit of each of the second page buffers PBG2 may be turned off at timing T2 later than timing T1. A level of a sensing node of each of the first page buffers PBG1 and a level of a sensing node of each of the second page buffers PBG2 may be changed by the magnitude of current flowing to a bitline, depending on whether a memory cell receiving the read voltage is turned on or off.

As illustrated in FIG. 11, each of the first page buffers PBG1 may precharge a sensing node from timing T0 to timing T1 and may develop first bitlines from timing T1 to timing T4. On the other hand, each of the second page buffers PBG2 may precharge the sensing node from timing T0 to timing T2 and may develop second bitlines from timing T2 to timing T4 later than timing T1.

The OVS read operation may include a first sensing operation, in which cell count information is collected and a detection case is determined based on the collected cell count information, and a second sensing operation in which a development operation is performed depending on the detection case, determined in the first sensing operation, to generate read data. The first sensing operation may include a latch reset (nS) sensing operation at timing T3 and a latch set (S) sensing operation at timing T5. First cell count information may be calculated using an ON-cell count value of the latch reset (nS) sensing operation and the latch set (S) sensing operation performed in the first page buffers PBG1. In addition, the second cell count information may be calculated using an ON-cell count value of the latch reset (nS) sensing operation and the latch set (S) sensing operation performed in the second page buffers PGB2.

Among detections cases C1 to C5 depending on states S1 and S2 of the memory cells, a detection case corresponding to an optimal read level may be determined based on the first cell count information and the second cell count information obtained in the first sensing operation. As an example, the detection case corresponding to the optimal read level may correspond to a distribution valley of the states S1 and S2 of the memory cells. In the second sensing operation, one of development time information tSODev1 to tSODev5 may be selected based on the detection case determined in the first sensing operation.

The cell count information, the detection case and the like, generated in the OVS read operation, may be output as detection information to the memory controller together with the read data generated by the OVS read operation. When no error is present in the read data generated by the OVS read operation or an error is successfully corrected, the memory controller may update a table stored in the memory controller using the detection case. As described above, the table may be a table in which a static offset voltage to be applied to a read voltage is written.

When the error of the read data generated by the OVS read operation is not corrected, the memory controller may input cell count information to a machine learning model to obtain a dynamic offset voltage. The memory controller may control the memory device to re-perform the read operation using a corrected read voltage reflecting the dynamic offset voltage. When no error is present in read data obtained as a result of the read operation re-performed by the memory device or an error is successfully corrected, the table may be updated using the dynamic offset voltage.

Figures 12, 13:
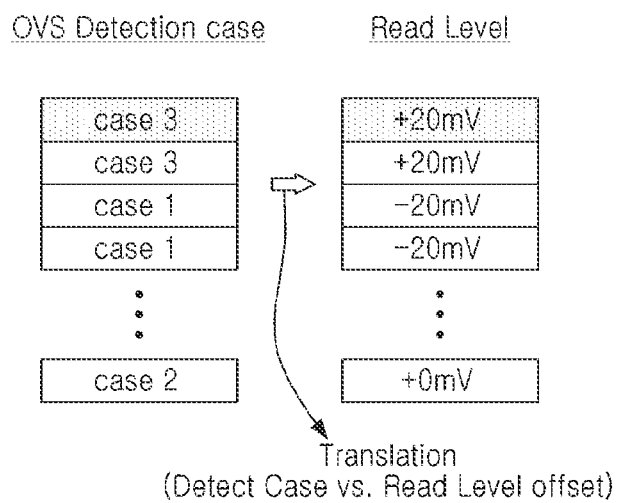
FIGS. 12 and 13 are diagrams illustrating a table update method of a memory controller according to example embodiments.

FIGS. 12 and 13 are diagrams illustrating a table update method of a memory controller according to example embodiments.

As described above with reference to FIGS. 10 and 11, an offset voltage, which should be reflected in a read voltage, may be determined depending on an optimal detection case determined in a first sensing operation of an OVS read operation. As an example, an OVS circuit of a memory device may determine a detection case based on cell count information determined from a threshold voltage distribution in a first sensing operation.

The memory device may output detection information of the OVS read operation and read data to a memory controller. As described above, the detection information may include cell count information and a detection case.

When the error correction circuit successfully corrects an error in the read data, the memory controller may generate a static offset voltage corresponding to the detection cases and write the static offset voltage in a second table. As an example, when the detection case determined in the second sensing operation of the OVS read operation is a third detection case C3, the memory controller may write a static offset voltage of +20 mV corresponding to the third detection case C3 in the second table.

FIG. 13 is a diagram illustrating a second table according to an example embodiment. In the example embodiment illustrated in FIG. 13, 3 bits of data may be written in each memory cell. Thus, each memory cell may have one state, among eight states, according to the written data. The second table may write seven read voltages RP1 to RP7 for determining eight states and a second static offset voltage depending on detection cases C1 to C5 determined in an OVS read operation.

The second static offset voltage written in the second table may be added to a first static offset voltage, written in a first table, to be written in a third table as a third static offset voltage. As described above, the first table may be a table in which a first static offset voltage depending on at least one piece of degradation information is written. When a read operation starts, the memory controller may determine a default level of a read voltage based on the third table to increase a possibility of a read pass in which an error correction circuit does not fail to correct an error in read data. Hereinafter, this will be described in more detail with reference to FIGS. 14A to 14C and FIGS. 15A to 15C.

FIGS. 14A to 14C and FIGS. 15A to 15C are diagrams illustrating an operation of a memory controller according to example embodiments.

Figure 14A:
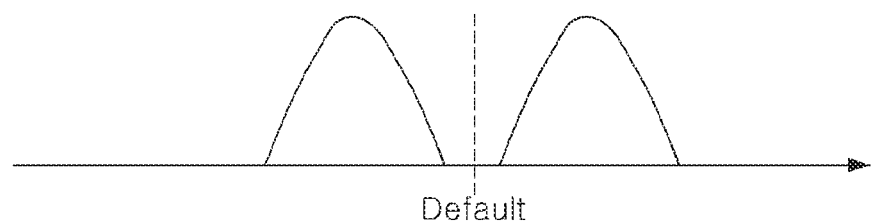
FIGS. 14A to 14C and FIGS. 15A to 15C are diagrams illustrating an operation of a memory controller according to example embodiments.
Figure 14B:
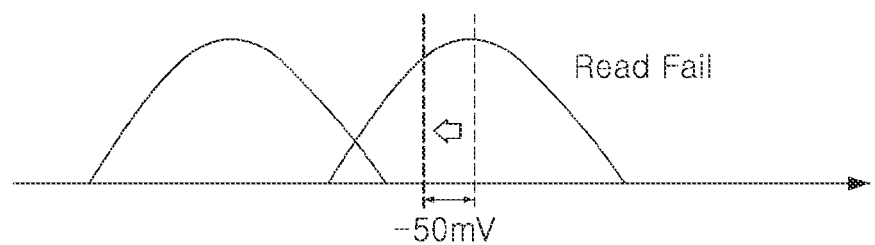
Figure 14C:
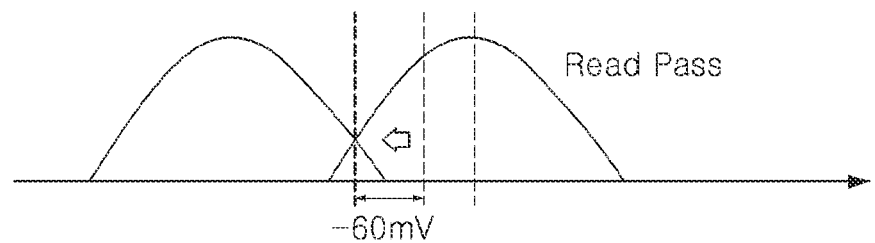

FIGS. 14A to 14C may be views illustrating the case in which a first static offset voltage is insufficient. Referring to FIGS. 14A and 14B, a threshold voltage distribution of a memory cell may be degraded so as to fail to reach an optimal read voltage with only −50 mV, a first static offset voltage written in a first table. Accordingly, as illustrated in FIG. 14B, when a read operation is performed using a read voltage reflecting only the first static offset voltage, the prospect of correcting an error in read data fails, that is, the possibility of read failure may be increased. When the read failure occurs, the memory controller may control a memory device to perform an OVS read operation and the memory device may find an optimal detection case through the OVS read operation and may perform a read operation in a manner of adjusting a development time depending on an offset voltage corresponding to the detection case to generate read data.

When the error in the read data generated by the OVS read operation is successfully corrected, the memory controller may calculate a second static offset voltage corresponding to the detection case determined by the OVS read operation and may store the calculated second static offset voltage in the second table. As an example, in the embodiment illustrated in FIG. 14C, the second static offset voltage may be −60 mV. Thus, in the next read operation, a default level of the read voltage may be determined by reflecting a third static offset voltage of −110 mV, a sum of the first static offset voltage and the second static offset voltage and the prospect of a read pass may be increased to improve reliability of the read operation.

Figure 15A:
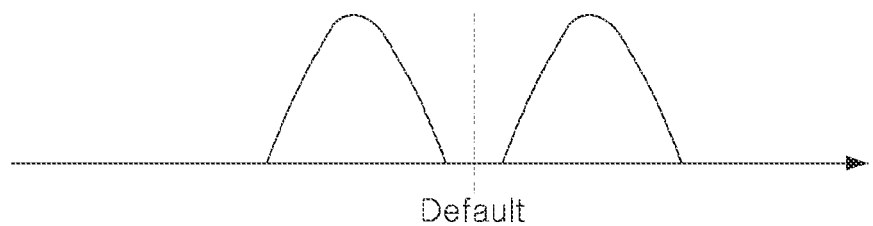
Figure 15B:
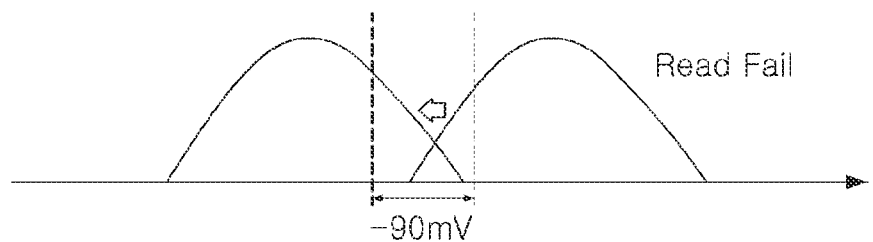
Figure 15C:
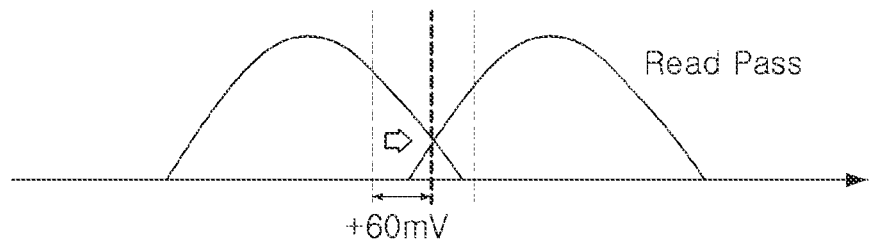

FIGS. 15A to 15C may be diagrams illustrating the case in which a first static offset voltage is excessive. Referring to FIGS. 15A and 15B, a threshold voltage distribution of a memory cell may be less degraded so as to fail to reach an optimal read voltage with −90 mV, the first static offset voltage written in a first table. Thus, as illustrated in FIG. 15B, when a read operation is performed using a read voltage reflecting only the first static offset voltage, the prospect of a read failure may be increased. When the read failure occurs, the memory controller may control a memory device to perform an OVS read operation and the memory device may determine a detection case and may generate read data through an OVS read operation.

When the error in the read data generated by the OVS read operation is successfully corrected, the memory controller may calculate a second static offset voltage corresponding to a detection case determined by the OVS read operation and may store the calculated second static offset voltage in a second table. As an example, in the embodiment illustrated in FIG. 14C, the second static offset voltage may be −60 mV. Thus, in the next read operation, a default level of the read voltage may be determined by reflecting a third static offset voltage of −30 mV, a sum of the first static offset voltage and the second static offset voltage, and reliability of the read operation may be improved.

Figure 16:
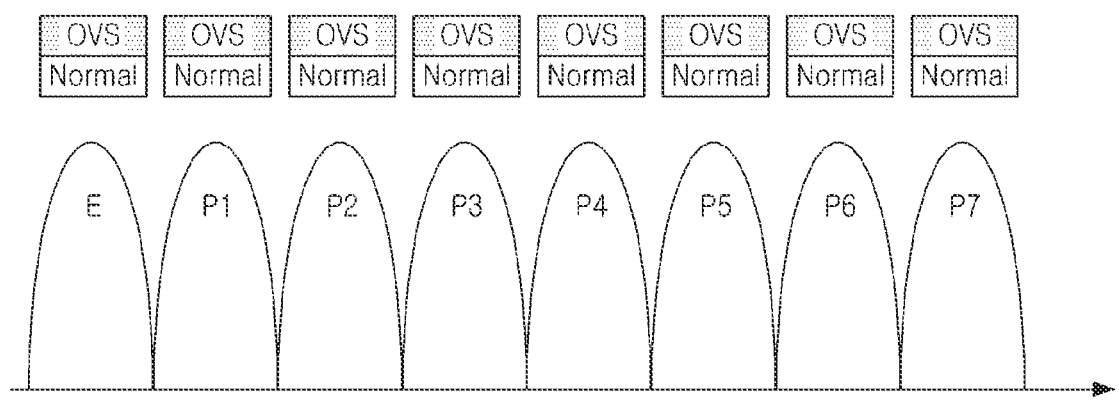
FIG. 16 is a diagram illustrating an operation of a memory device according to example embodiments.

FIG. 16 is a diagram illustrating an operation of a memory device according to example embodiments.

Referring to FIG. 16, an OVS read operation may be applied to all states E to P7 that memory cells are able to have. Thus, cell count information may be calculated in all of the states E to P7, and may be transmitted to a memory controller as detection information of the OVS read operation.

When error correction of read data generated by the OVS read operation fails, cell count information may be input to a machine learning model to obtain a dynamic offset voltage in example embodiments. The dynamic offset voltage may be reflected in a read voltage, and a memory device may re-perform a read operation using a corrected read voltage reflecting the dynamic offset voltage.

The machine learning model may be a model trained to receive cell count information to output a dynamic offset voltage for determining an optimal read voltage. In an example embodiment, cell count information obtained from all of the states E to P7 that memory cells are able to have, rather than only the highest state P7 and the least state E, may be input to the machine learning model. Accordingly, as compared with the case in which only cell count information of the highest state P7 and the least state E is input to a machine learning model, a more accurate dynamic offset voltage may be obtained and reliability of a read operation using a corrected read voltage may be improved.

Figure 17:
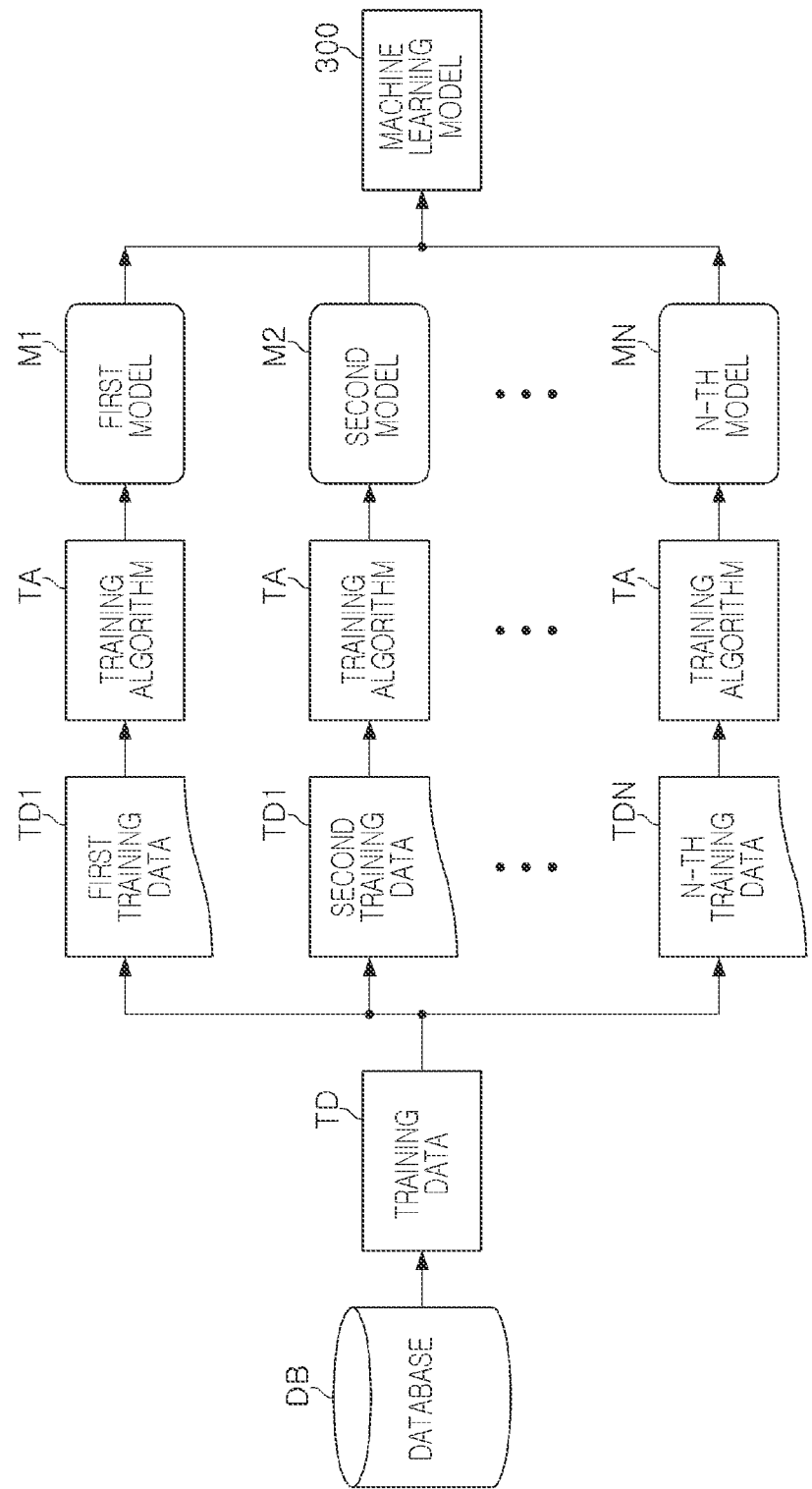
FIG. 17 is a diagram illustrating a machine learning model included in a memory controller according to example embodiments.

FIG. 17 is a diagram illustrating a machine learning model included in a memory controller according to example embodiments.

In an example embodiment, a machine learning model 300 may receive predetermined input data to output output data. As an example, the input data may be cell count information, obtained as a result of an OVS read operation performed by a memory device, and other degradation information. The degradation information may include a time elapsed after a program operation, program/erase operation cycles, a read operation cycle, and the like. As described with reference to FIG. 16, cell count information may be obtained in all states that memory cells are able to have. The output data may be a dynamic offset voltage for determining an optimal level of a read voltage.

The machine learning model 300 may be pre-trained to receive cell count information, other degradation information, and the like, to output a dynamic offset voltage. Referring to FIG. 17, database DB may be provided to train the machine learning model 300 and training data TD may be stored in the database DB. To train the machine learning model 300, the training data TD may be selected from the database DB and may be classified into first to N-th training data TD1 to TDN.

As an example, the training data TD may include data indicating a degraded threshold voltage distribution of memory cells. The first to N-th training data TD1 to TDN may be generated by performing data pre-processing such as performing predetermined filtering on the training data TD, merging threshold voltage distributions having different resolutions, and the like. A training algorithm TA performs training using the first to N-th training data TD1 to TDN to generate a plurality of models M1 to MN. For example, the number of models M1-MN may be determined according to the number of bits of data stored in each of the memory cells. As an example, when 3 bits of data are stored in each of the memory cells, at least seven trees may be generated by the training. When 4 bits of data are stored in each of the memory cells, at least fifteen trees may be generated by the training.

However, the embodiment described with reference to FIG. 17 is only an embodiment for generating the machine learning model 300 and the machine learning model 300 may be generated in various other manners.

Figure 18:
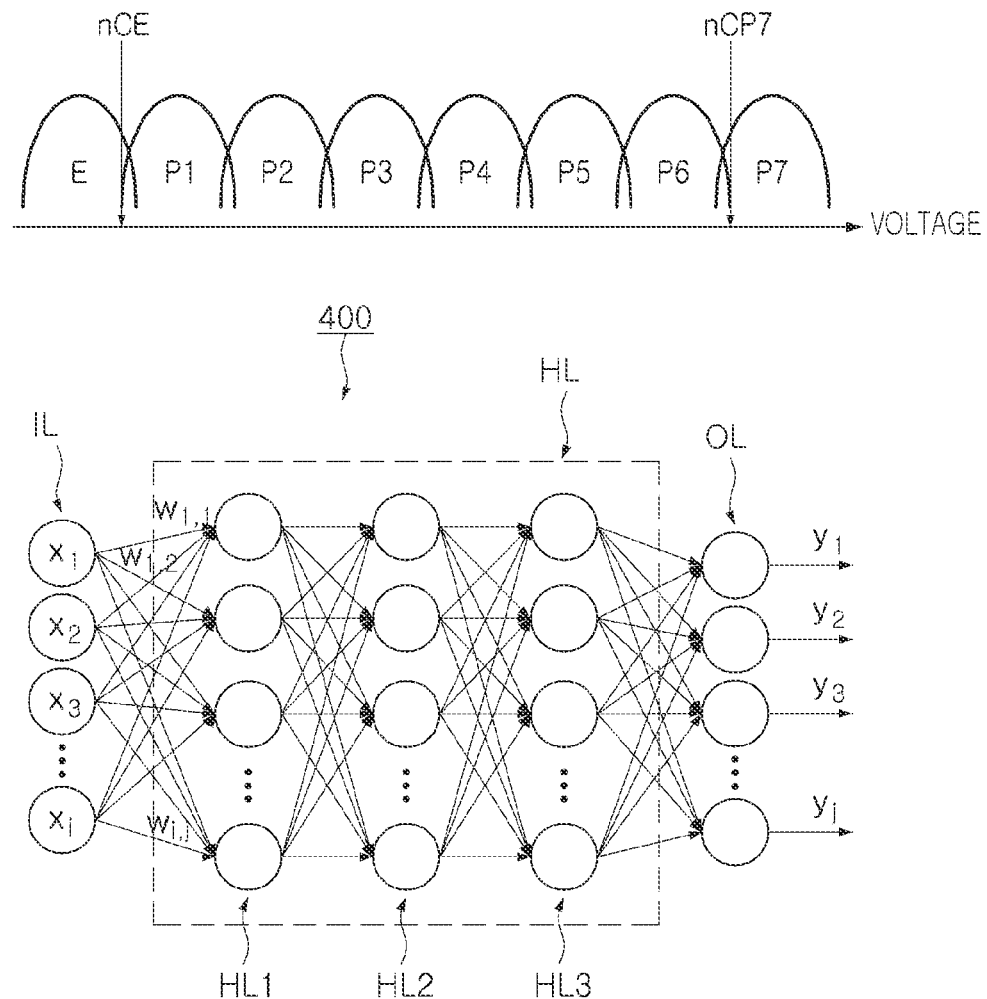
FIGS. 18 and 19 are diagrams illustrating an operation of a memory controller according to example embodiments.
Figure 19:
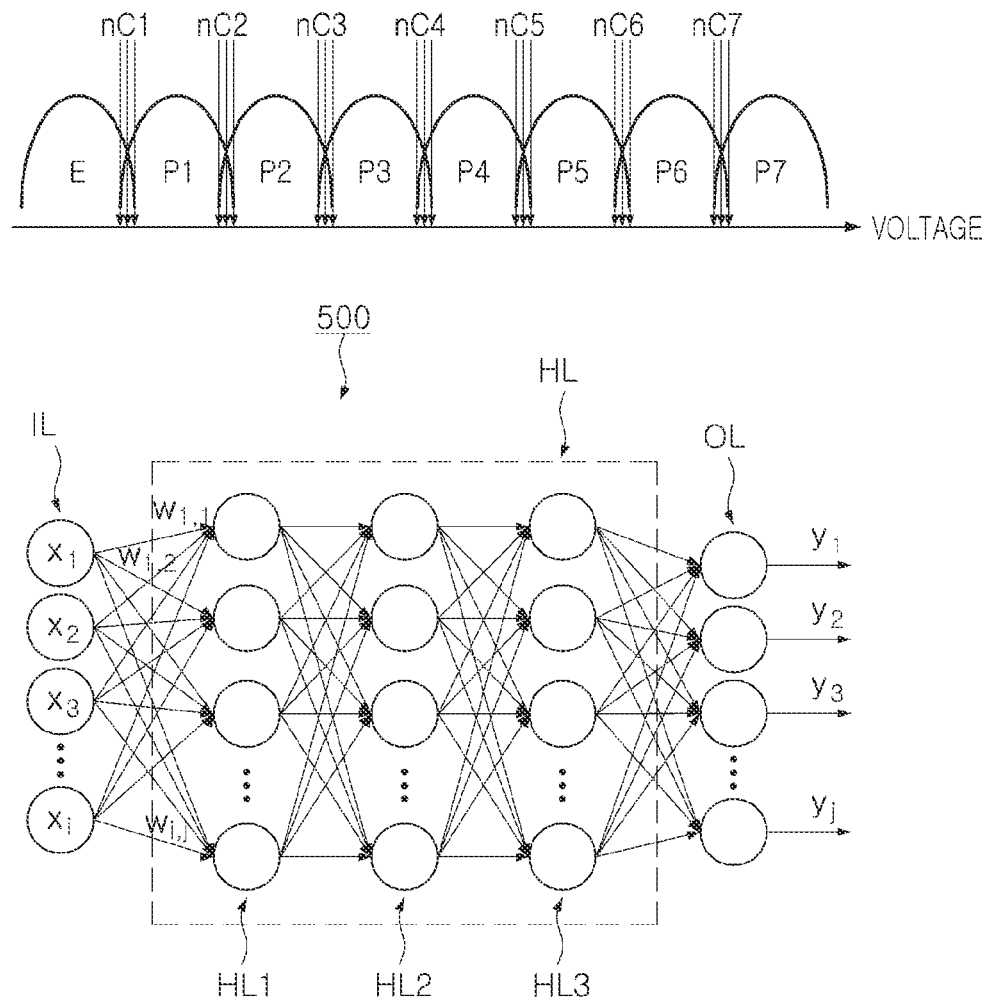

FIGS. 18 and 19 are diagrams illustrating an operation of a memory controller according to example embodiments.

In embodiments illustrated in FIGS. 18 and 19, 3 bits of data may be stored in each memory cell of a memory device. However, this is an example embodiment, and the number of bits of data stored in the memory cells may vary. Since 3 bits of data are stored in each memory cells, a threshold voltage distribution of each memory cell may be divided into eight states E to P7.

Referring to FIGS. 18 and 19, machine learning models 400 and 500 may include an artificial neural network having a fully connected network. The machine learning models 400 and 500 may include an input layer IL, an output layer OL, and a hidden layer HL therebetween. The hidden layer HL may include a plurality of hidden layers HL1 to HL3 connected to each other in a fully connected network. However, this is an example embodiment, and the machine learning models 400 and 500 may further include neural networks having various other networks.

Each of the machine learning models 400 and 500 may receive cell count information and degradation information of memory cells to output a dynamic offset voltage for determining an optimum level of a read voltage. In the embodiment illustrated in FIG. 18, cell count information input to the first machine learning model 400 may include lowest order cell count information nCE and highest order cell count information nCP7. The machine learning model 400 may be trained to predict a threshold voltage distribution of the other states P1 to P6 using the lowest order cell count information nCE, calculated in the erase state E, and the highest order cell count information nCP7 calculated in the seventh program state P7.

However, in the embodiment illustrated in FIG. 18, since the first machine learning model 400 outputs a dynamic offset voltage using only the lowest order cell count information nCE and the highest order cell count information nCP7, cell count information of each of the plurality of states E to P7 may be inaccurately reflected. Moreover, a dummy sensing operation may be required to additionally obtain the lowest order cell count information nCE and the highest order cell count information nCP7, causing overall latency of the read operation to be increased.

Referring to FIG. 19, in an example embodiment, an OVS read operation may be performed before using the second machine learning model 500. The memory controller may receive cell count information nC1 to nC7 generated in the OVS read operation from the memory device and then may input the received cell count information nC1 to nC7 to the second machine learning model 500. In the OVS read operation, since the cell count information nC1 to nC7 are generated in each of the plurality of states E to P7 that the memory cells have, the machine learning model may be trained to receive not only the lowest order cell count information nCE and the highest order cell count information nCP7 but also all of the cell count information nC1 to nC7 of each of the plurality of states E to P7 to output a dynamic offset voltage. Thus, an optimum level of the read voltage may be effectively found.

In addition, since the cell count information nC1 to nC7 generated in the OVS read operation, rather than a separate dummy sensing operation, are input to the second machine learning model 500 to obtain a dynamic offset voltage, an increase in latency of the read operation may be significantly reduced. As described above, the operation of inputting the cell count information nC1 to nC7 to the second machine learning model 500 to obtain the dynamic offset voltage may be performed only when correction of an error in read data received from the memory device as a result of the OVS read operation fails.

Figure 20A:
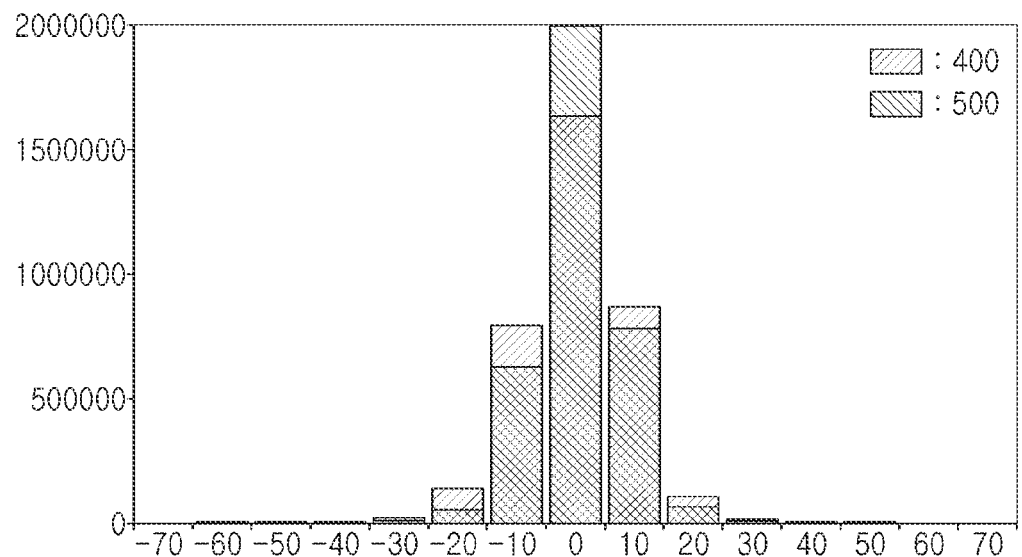
FIGS. 20A and 20B are diagrams illustrating an operation of a storage device according to example embodiments.
Figure 20B:
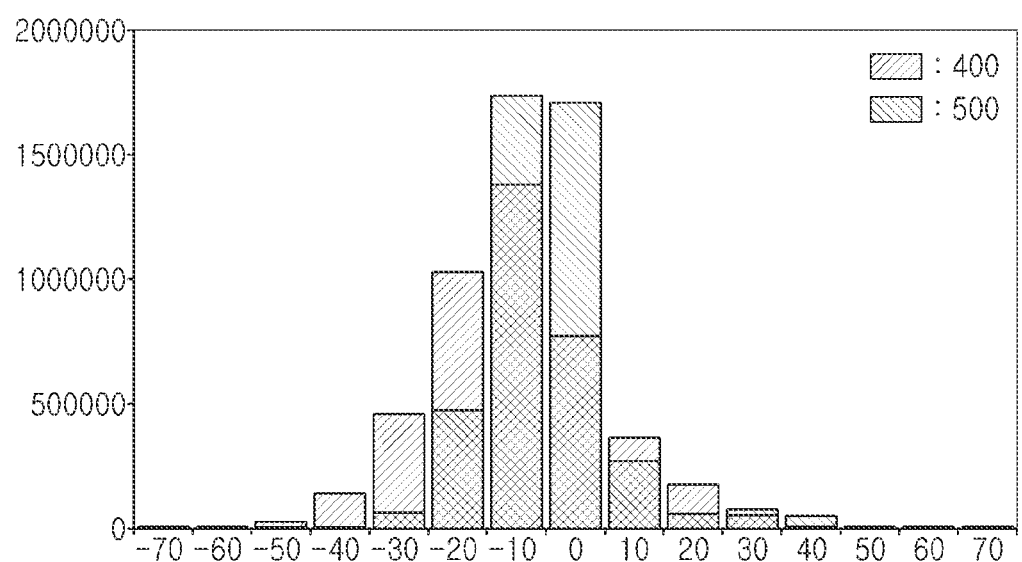

FIGS. 20A and 20B are diagrams illustrating an operation of a storage device according to example embodiments.

FIGS. 20A and 20B may be views for comparing performance of a first machine learning model 400, trained based on the lowest order cell count information nCE and the highest order cell count information nCP7 illustrated in FIG. 18, with performance of a second machine learning model 500 trained based on the cell count information nC1 to nC7 of all states illustrated in FIG. 19. In FIGS. 20A and 20B, a horizontal axis may represent a difference between an optimum level of a read voltage and a prediction level output from the machine learning models 400 and 500.

FIG. 20A may be a graph illustrating a result of a test performed using training data. Referring to FIG. 20A, it will be understood that both the first machine learning model 400 and the second machine learning model 500 exhibit improved predictive power. The case in which a difference between an optimal level and a prediction level of a read voltage is 0 mV exists more in the second machine learning model 500 than in the first machine learning model 400. Accordingly, the second machine learning model 500 may be determined to have superior predictive power.

FIG. 20B may be a graph illustrating a result of a test performed using new data, rather than training data. Referring to FIG. 20B, not only the case in which a difference of an optimal level and a prediction level of a read voltage is 0 mV but also the case in which the difference is −10 mV to +10 mV exists more in the second machine learning model 500 than in the first machine learning model 400. Accordingly, the second machine learning model 500 may be determined to have superior predictive power.

Figure 21:
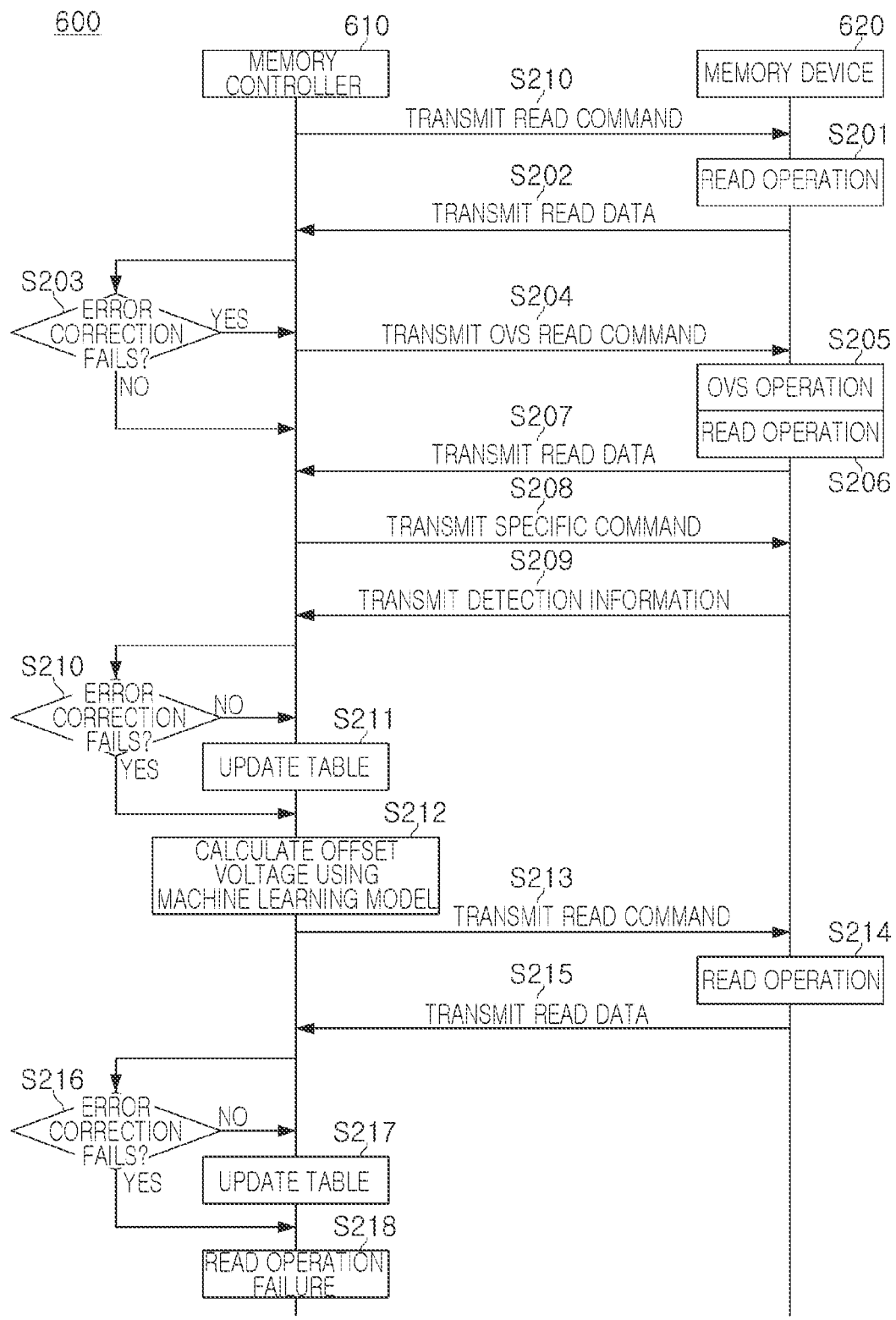
FIG. 21 is a flowchart illustrating an operation of a storage device according to example embodiments.

FIG. 21 is a flowchart illustrating an operation of a storage device according to example embodiments.

Referring to FIG. 21, an operation of a storage device 600 according to an example embodiment may start with an operation S200 in which a memory controller 610 transmits a read command to a memory device 620. The memory controller 610 may generate a read command in response to a read request received from an external host connected to the storage device 600 and may transmit the generated read command to the memory device 620.

The read command may include a read voltage, determined to be a default level, together with an address signal. The default level may be a value determined by the memory controller 610 and may be an initial value stored in the memory controller 610 or a value obtained by adding a static offset voltage, reflected in a read voltage in a previous read request, to the initial value. In a buffer memory, or the like, of the memory controller 610, the static offset voltage reflected in the read voltage in the previous read request may be written in the form of a table, and the memory controller 610 may determine a default level of the read voltage based on the table.

The memory device 620 may perform a read operation on selected memory cells corresponding to address information in response to a read command (S201) and may transmit read data to the memory controller 610 as a result of the read operation (S202). An error correction circuit of the memory controller 610 may detect and correct an error in the read data (S203). When the error correction circuit successfully corrects the error or no error is detected, the read operation may be completed. Meanwhile, when the error correction circuit fails to correct the error, the memory controller 610 may transmit an OVS read command to the memory device 620 (S204).

The memory device 620, receiving the OVS read command, may sequentially perform an OVS operation and a read operation (S205 and S206). The OVS operation may be an operation of controlling a plurality of page buffers to latch data at different times to find an optimal valley in a threshold voltage distribution. In the OVS operation, cell count information on each of a plurality of states of memory cells and a detection case may be determined. In the read operation in S206, the memory device 620 may perform a sensing operation according to a development time determined in consideration of the offset voltage for the read voltage corresponding to the detection case determined in the OVS operation. The memory device 620 may transmit read data to the memory controller 610 in response to the OVS read command (S207).

The memory controller 610 may transmit a special command to the memory device 620 (S208), and the memory device 620 may transmit detection information of the OVS operation to the memory controller 610 in response to the special command (S209). The detection information may include cell count information, detection cases, and the like. According to embodiments, operation S208 and S209 may be performed ahead of operation S207 in which the read data is transmitted to the memory controller 610. The detection information may be transmitted through at least one pin, among data pins and control pins connecting the memory controller 610 and the memory device 620 to each other, for example, at least one data pin, among data pins assigned to a data signal DQ.

The error correction circuit of the memory controller 610 may detect and correct an error in read data (S210). When the error correction circuit successfully corrects the error or no error is detected, a table may be updated (S211) and the read operation may be completed. As an example, the memory controller 610 may include a first table in which a first static offset voltage depending on degradation information is written in a buffer memory, or the like, a second table in which a second static offset voltage matching a detection case depending on a result of the OVS operation is written, and a third table in which a third static offset voltage calculated as a sum of the first static offset voltage and the second static offset voltage is written. In operation S211, the memory controller 610 may update the second table and the third table.

Meanwhile, when the error correction circuit fails to correct the error, the memory controller 610 may calculate a dynamic offset voltage using a machine learning model (S212). As an example, the memory controller 610 may input cell count information, included in the detection information received in operation S209, to the machine learning model to obtain a dynamic offset voltage. According to embodiments, degradation information other than the cell count information may be input to the machine learning model. The memory controller 610 may transmit a read command to the memory device 620 together with a corrected read voltage having a level corrected using the dynamic offset voltage (S213). The read command, transmitted in operation S213, may include address information such as the read command transmitted in operation S200 and may be a command instructing a normal read operation.

The memory device 620 may perform a read operation on selected memory cells in response to the read command received in operation S213 (S214). However, in operation S214, the corrected read voltage may be input to selected wordlines connected to the selected memory cells. The memory device 620 may transmit read data to the memory controller 610 as a result of the read operation (S215), and the error correction circuit of the memory controller 610 may detect and correct an error in the read data (S216).

When no error is detected or an error is successfully corrected in operation S216, the memory controller 610 may update a table (S217) and may complete the read operation. The table updated in operation S217 may be a third table. Meanwhile, when correction of the error fails in operation S216, the memory controller 610 may determine that the read operation failed (S218), and may notify a host of the failure. Alternatively, a read operation using an off-chip valley search operation may be additionally performed.

In the embodiment described with reference to FIG. 21, when no error is detected in the read data or when an error is successfully corrected, the read operation may be performed once. In addition, when no error is detected in read data obtained by an OVS read operation or when an error is successfully corrected, the read operation may be performed twice. In addition, even when the read operation is performing using a corrected read voltage reflecting a dynamic offset voltage output by a machine learning model, the dynamic offset voltage may be obtained from the cell count information obtained in the OVS operation. Thus, an increase in latency of the read operation may be significantly reduced.

Figure 22:
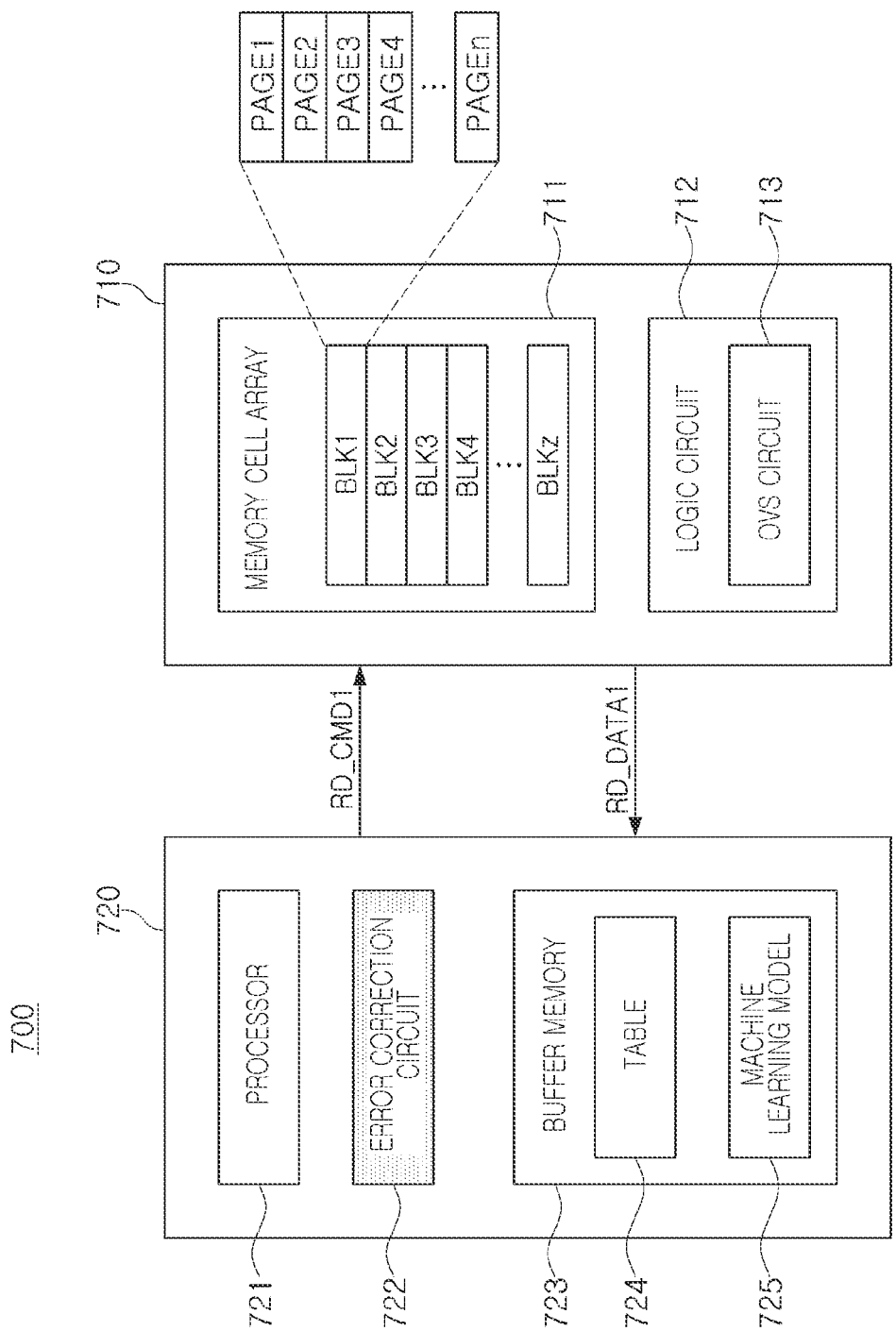
FIGS. 22 and 25 are diagrams illustrating an operation of a storage device according to example embodiments.
Figure 25:
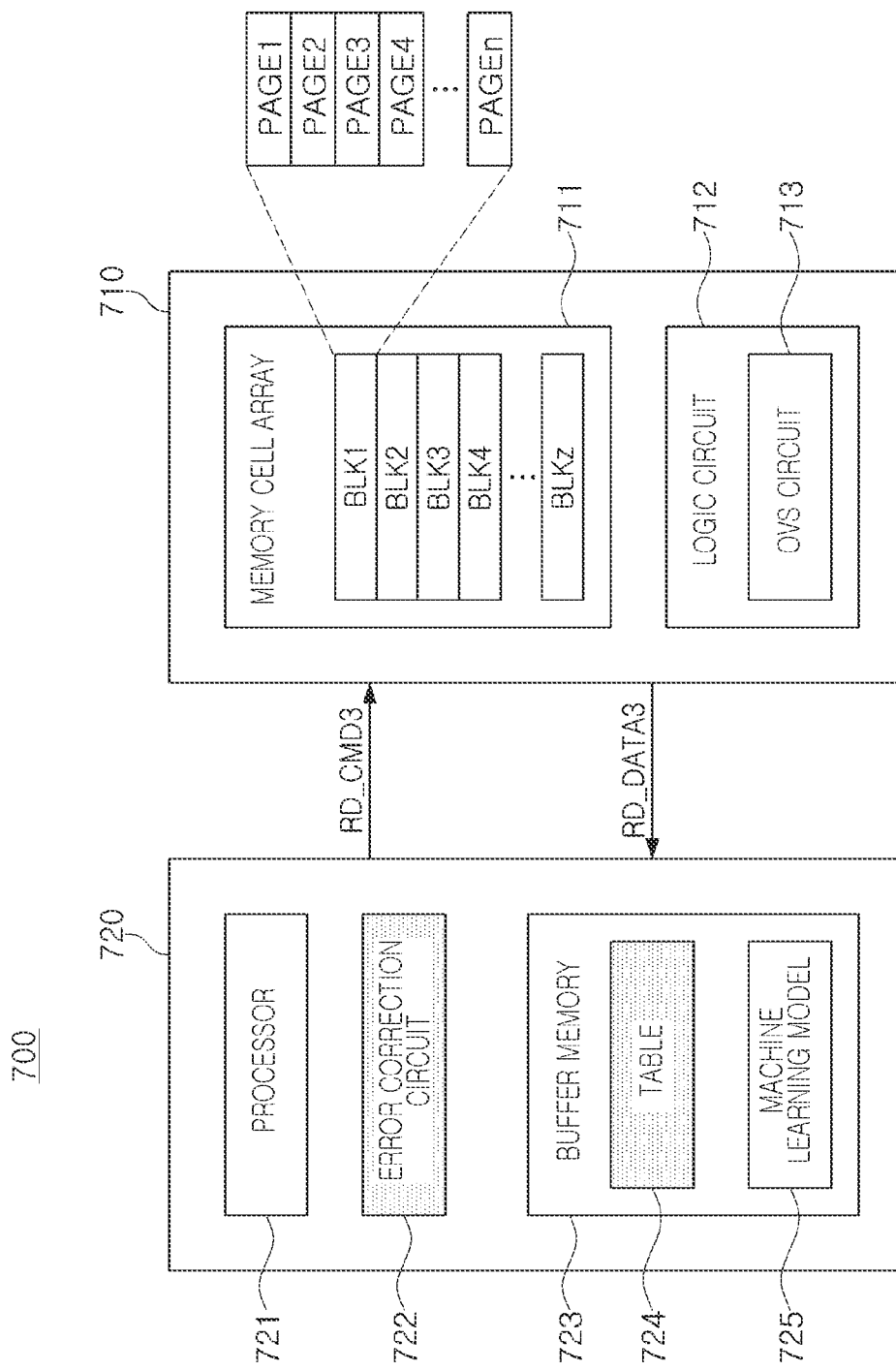

FIGS. 22 and 25 are diagrams illustrating an operation of a storage device according to example embodiments.

Referring to FIGS. 22 to 25, a storage device 700 may include a memory device 710 and a memory controller 720. The memory device 710 may include a memory cell array 711, including memory cells, and a logic circuit 712. The logic circuit 712 may include an OVS circuit 713 for performing an OVS operation. In the memory cell array 711, memory cells may be classified into a plurality of blocks BLK1 to BLKz. Each of the plurality of blocks BLK1 to BLKz may include a plurality of pages PAGE1 to PAGEn. The memory controller 720 may include a processor 721, an error correction circuit 722, and a buffer memory 723. A table 724 and a machine learning model 725 may be stored in the buffer memory 723.

When receiving a read request from a host interconnected with the storage device 700, the processor 721 of the memory controller 720 may generate a first read command RD_CMD1 and may transmit the generated first read command RD_CMD1 to the memory device 710. A read voltage, included in the first read command RD_CMD1, may have a first level and the first level may be determined by the memory controller 720.

The logic circuit 712 of the memory device 710 may perform a first read operation in response to the first read command RD_CMD1 and may output the first read data RD_DATA1 to the memory controller 720. The error correction circuit 722 of the memory controller 720 may detect and correct an error in the first read data. When no error is detected or when the error is successfully corrected, the read operation may be completed.

Figure 23:
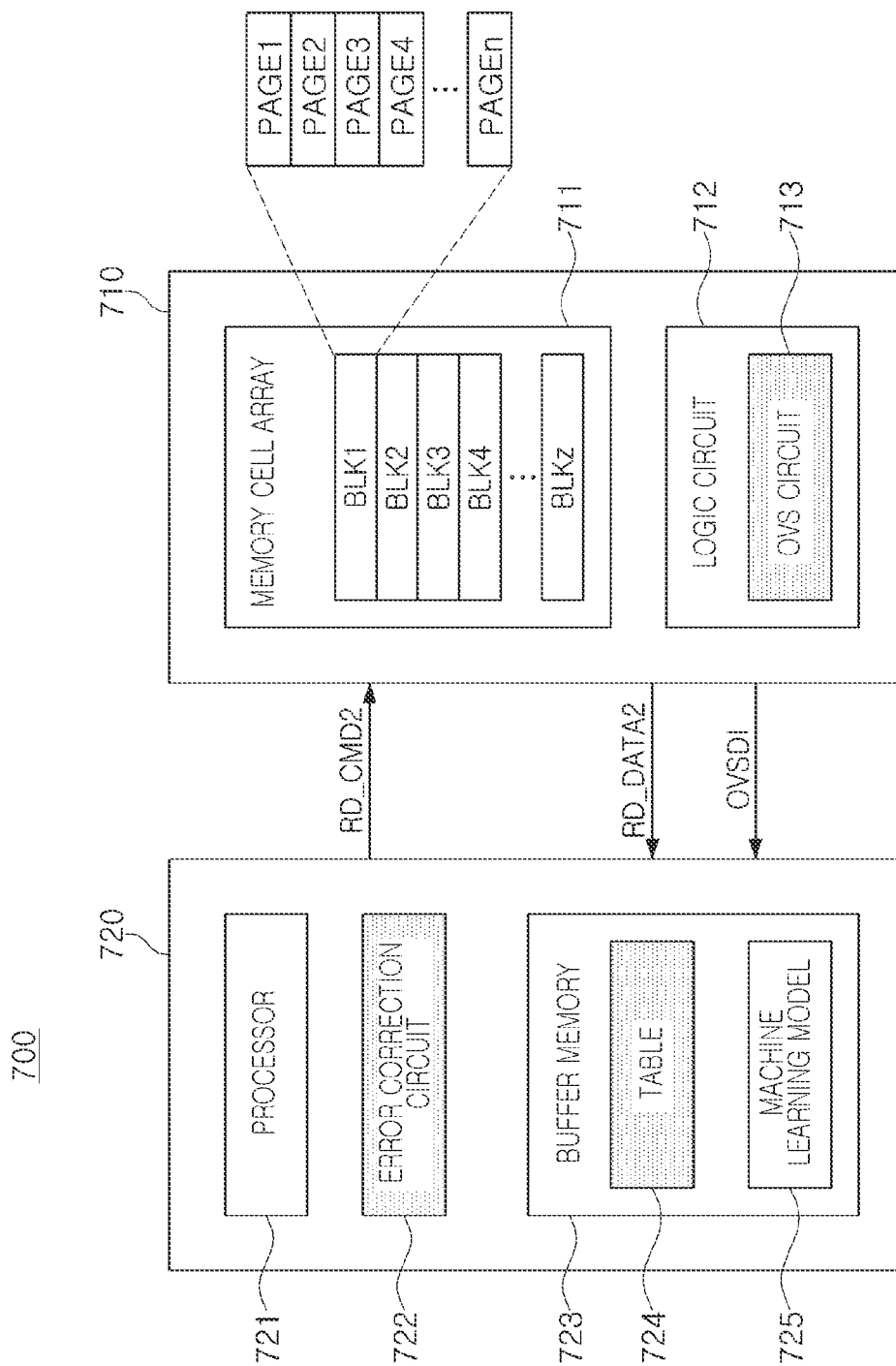

When the error correction circuit 722 fails to correct the error, the processor 721 may generate a second read command RD_CMD2 and may transmit the generated second read command RD_CMD2 to the memory device 710, as illustrated in FIG. 23. As an example, the second read command RD_CMD2 may be an OVS read command instructing an OVS operation. The logic circuit 712 of the memory device 710 may enable the OVS circuit 713 to perform an OVS operation and may obtain detection information, such as a cell count information detection case, as a result of the OVS operation. The memory device 710 may generate second read data RD_DATA2 in response to the second read command RD_CMD2 and may output the second read data RD_DATA2 to the memory controller 720. The memory device 710 may also transmit detection information OVSDI of the OVS operation to the memory controller 720.

The error correction circuit 722 may detect and correct an error in the second read data RD_DATA2. When no error is detected or when the error correction circuit 722 successfully corrects a detected error, the processor 721 may write a static offset voltage, corresponding to the detection case, in the table 724 to update the table 724.

Figure 24:
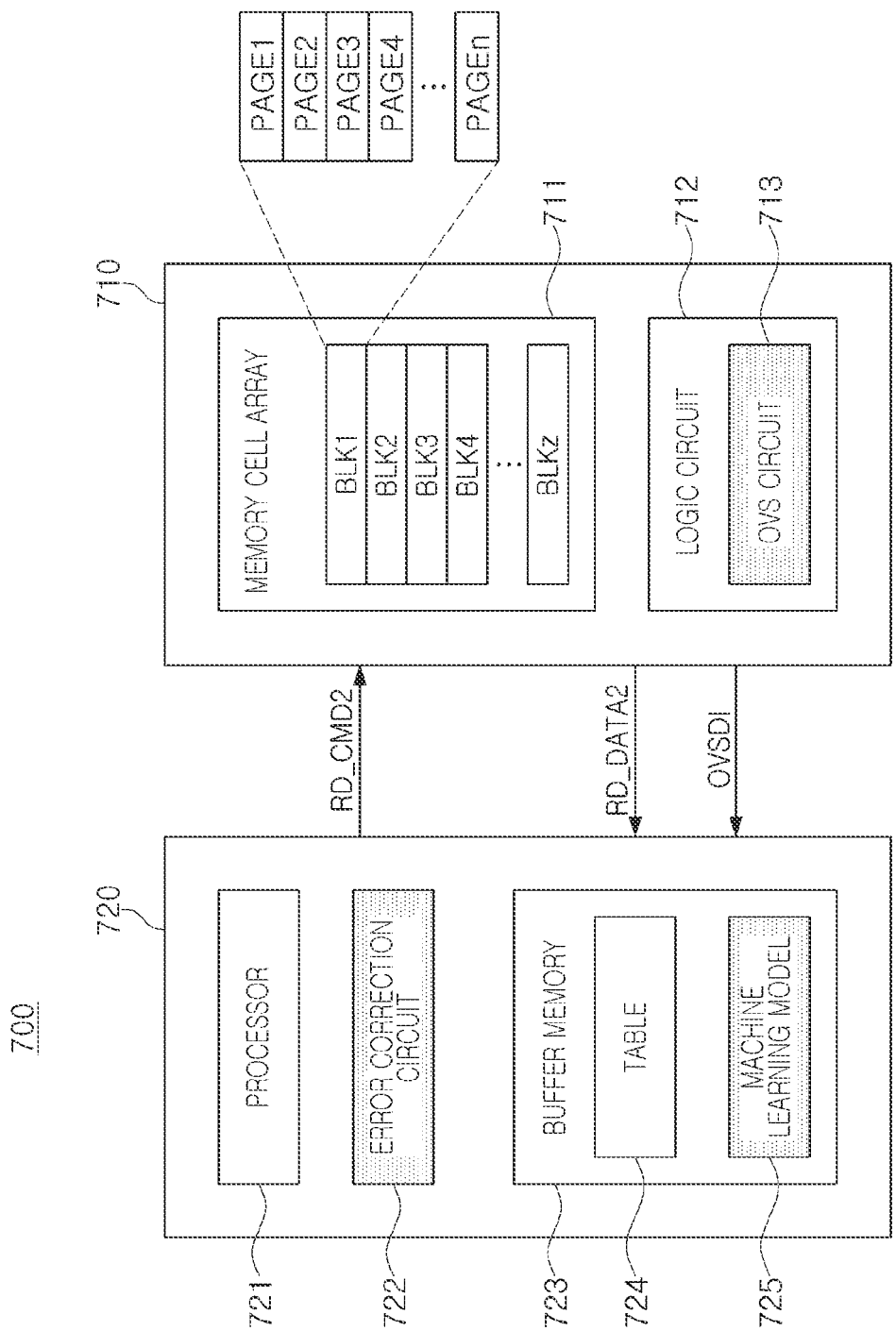

Meanwhile, when the error correction circuit 722 fails to correct the error in the second read data RD_DATA2, a level of the read voltage may be corrected using the machine learning model 725, as illustrated in FIG. 24. As an example, the processor 721 may input cell count information and degradation information of memory cells, included in the detection information OVSDI, to the machine learning model 725 to obtain a dynamic offset voltage and may obtain a corrected read voltage having a second level, different from the first level, using the obtained dynamic offset voltage.

Referring to FIG. 25, the memory controller 720 may transmit a third read command RD_CMD3, including the corrected read voltage, to the memory device 710. As an example, the third read command RD_CMD3 may be a command instructing the same read operation as the first read command RD_CMD1. In other words, the third read command RD_CMD3 may be the same command as the first read command RD_CMD1 except that the third read command RD_CMD3 includes a corrected read voltage having a level different from the level of the first read voltage. The memory device 720 may input the corrected read voltage, included in the third read command RD_CMD3, to a selected wordline, connected to selected memory cells, to perform a read operation and may transmit third read data RD_DATA3 to the memory controller 720 as a result of the read operation.

The error correction circuit 722 may detect and correct an error in the third read data RD_DATA3. When no error is detected or when an error is successfully corrected, the processor 721 may write a dynamic offset voltage, reflected in the corrected read voltage, to the table 724 to update the table 724 and may complete the read operation. When correction of an error in the third read data RD_DATA3 also fails, the memory controller 720 may control the memory device 710 to perform a read operation together with an off-chip valley search operation.

As described above, according to an example embodiment, when a first read operation fails, a second read operation including an OVS operation may be performed. In addition, when the second read operation fails, a third read operation may be performed using the corrected read voltage generated using cell count information, or the like, included in the detection information of the OVS operation. Thus, reliability of the read operation may be improved. Moreover, since an unnecessary dummy sensing operation is not added during generation of the corrected read voltage using the machine learning model, an increase in latency of the read operation may be significantly reduced to improve performance of the storage device 700.

Figure 26:
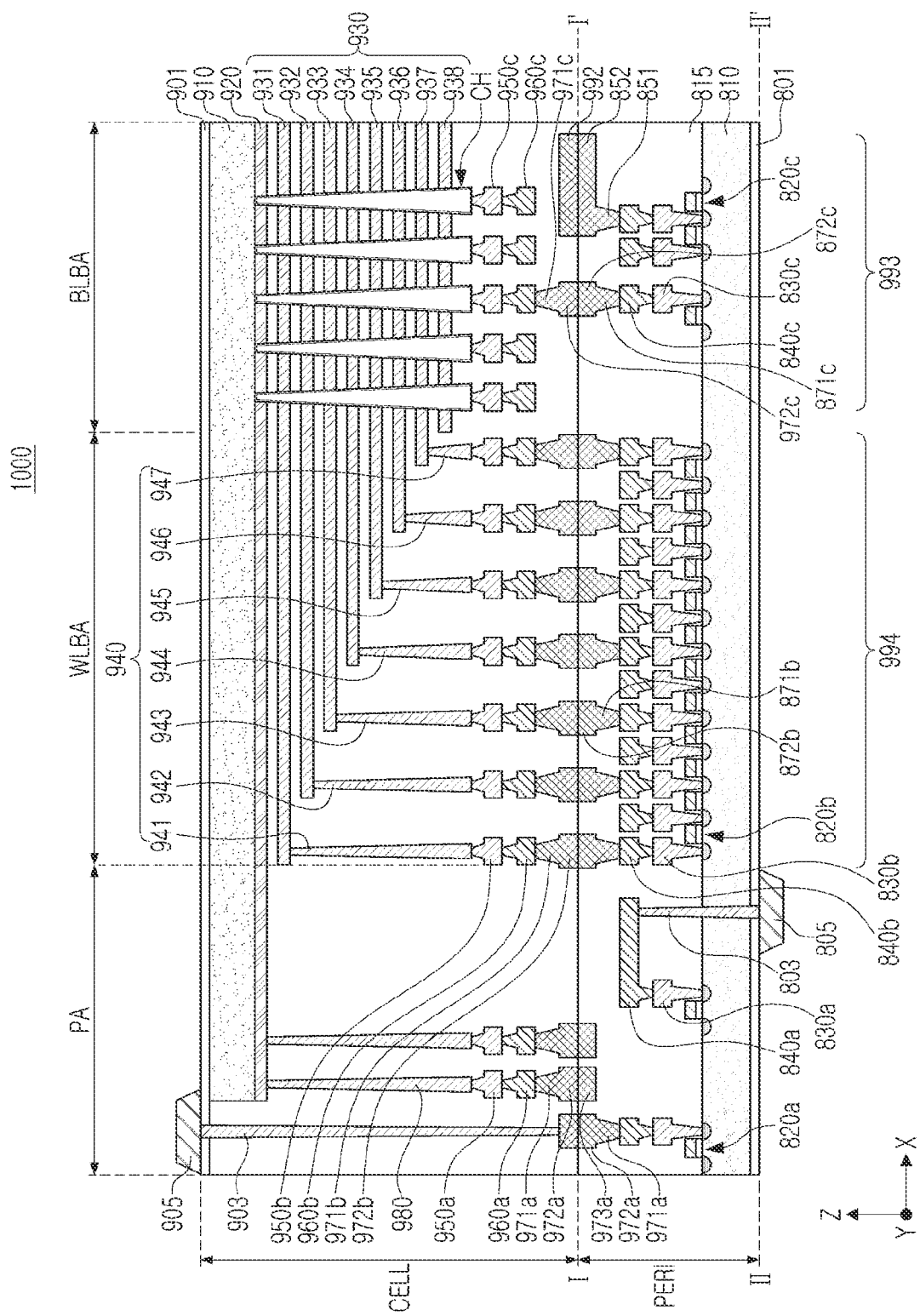
FIG. 26 is a diagram illustrating a memory device according to example embodiments.

FIG. 26 is a diagram illustrating a memory device according to example embodiments.

Referring to FIG. 26, a memory device 1000 may have a chip-to-chip (C2C) structure. The C2C structure may refer to a structure formed by manufacturing an upper chip including a cell region CELL on a first wafer, manufacturing a lower chip including a peripheral circuit region PERI on a second wafer, different from the first wafer, and then bonding the upper chip and the lower chip to each other. As an example, the bonding process may include a process of electrically connecting a bonding metal formed on a lowermost metal layer of the upper chip and a bonding metal formed on an uppermost metal layer of the lower chip. For example, when the bonding metals include copper (Cu), the bonding process may be a Cu-to-Cu bonding process and the bonding metals may also be formed of aluminum (Al) or tungsten (W).

Each of the peripheral circuit region PERI and the cell region CELL of the memory device 1000 may include an external pad bonding area PA, a wordline bonding area WLBA, and a bitline bonding area BLBA.

The peripheral circuit region PERI may include a first substrate 810, an interlayer insulating layer 815, a plurality of circuit elements 820a, 820b, and 820c formed on the first substrate 810, first metal layers 830a, 830b, and 830c respectively connected to the plurality of circuit elements 820a, 820b, and 820c, and second metal layers 840a, 840b, and 840c formed on the first metal layers 830a, 830b, and 830c. In an embodiment, the first metal layers 830a, 830b, and 830c may be formed of tungsten having relatively high electrical resistivity and the second metal layers 840a, 840b, and 840c may be formed of copper having relatively low electrical resistivity.

In the specification, although only the first metal layers 830a, 830b, and 830c and the second metal layers 840a, 840b, and 840c are illustrated and described, the embodiment is not limited thereto and one or more additional metal layers may be further formed on the second metal layers 840a, 840b, and 840c. At least a portion of the one or more additional metal layers formed on the second metal layers 840a, 840b, and 840c may be formed of aluminum or the like having a lower electrical resistivity than those of copper forming the second metal layers 840*a*, 840*b*, and 840*c*.

The interlayer insulating layer 815 may be disposed on the first substrate 810 to cover the plurality of circuit elements 820*a*, 820*b*, and 820*c*, the first metal layers 830*a*, 830*b*, and 830*c*, and the second metal layers 840*a*, 840*b*, and 840*c*. The interlayer insulating layer 815 may include an insulating material such as silicon oxide, silicon nitride, or the like.

Lower bonding metals 871*b* and 872*b* may be formed on the second metal layer 840*b* in the word line bonding area WLBA. In the word line bonding area WLBA, the lower bonding metals 871*b* and 872*b* in the peripheral circuit region PERI may be electrically bonded to upper bonding metals 971*b* and 972*b* of the cell region CELL. The lower bonding metals 871*b* and 872*b* and the upper bonding metals 971*b* and 972*b* may be formed of aluminum, copper, tungsten, or the like.

The cell region CELL may include at least one memory block. The cell region CELL may include a second substrate 910 and a common source line 920. A plurality of wordlines 931 to 938 (i.e., 930) may be stacked on the second substrate 910 in a direction (a Z-axis direction), perpendicular to an upper surface of the second substrate 910. String select lines and ground select lines may be arranged above and below the plurality of wordlines 930, respectively. The plurality of wordlines 930 may be disposed between the string select lines and the ground select lines.

In the bitline bonding area BLBA, a channel structure CH may extend in the direction (the Z-axis direction), perpendicular to the upper surface of the second substrate 910, to penetrate through the plurality of wordlines 930, the string select lines, and the ground select lines. The channel structure CH may include a data storage layer, a channel layer, a buried insulating layer, and the like and the channel layer may be electrically connected to a first metal layer 950*c* and a second metal layer 960*c*. For example, the first metal layer 950*c* may be a bitline contact and the second metal layer 960*c* may be a bitline. In an embodiment, the bitline 960*c* may extend in a first direction (a Y-axis direction), parallel to the upper surface of the second substrate 910.

In the embodiment illustrated in FIG. 26, an area in which the channel structure CH, the bitline 960*c*, and the like are disposed may be defined as the bitline bonding area BLBA. In the bitline bonding area BLBA, the bitline 960*c* may be electrically connected to the circuit elements 820*c* providing a page buffer 993 in the peripheral circuit region PERI. The bitline 960*c* may be connected to upper bonding metals 971*c* and 972*c* in the cell region CELL, and the upper bonding metals 971*c* and 972*c* may be connected to lower bonding metals 871*c* and 872*c* connected to the circuit elements 820*c* of the page buffer 993.

In the wordline bonding area WLBA, the wordlines 930 may extend in a second direction (an X-axis direction), parallel to the upper surface of the second substrate 910 and perpendicular to the first direction and may be connected to a plurality of cell contact plugs 941 to 947 (i.e., 940). The plurality of wordlines 930 and the plurality of cell contact plugs 940 may be connected to each other in pads provided by at least a portion of the plurality of wordlines 930 extending by different lengths in the second direction. A first metal layer 950*b* and a second metal layer 960*b* may be connected to an upper portion of the plurality of cell contact plugs 940 connected to the plurality of wordlines 930, sequentially. The plurality of cell contact plugs 940 may be connected to the peripheral circuit region PERI through the upper bonding metals 971*b* and 972*b* of the cell region CELL and the lower bonding metals 871*b* and 872*b* of the peripheral circuit region PERI in the wordline bonding area WLBA.

The plurality of cell contact plugs 940 may be electrically connected to the circuit elements 820*b* forming a row decoder 994 in the peripheral circuit region PERI. In an embodiment, operating voltages of the circuit elements 820*b* providing the row decoder 994 may be different from operating voltages of the circuit elements 820*c* providing the page buffer 993. As an example, operating voltages of the circuit elements 820*c* providing the page buffer 993 may be greater than operating voltages of the circuit elements 820*b* providing the row decoder 994.

A common source line contact plug 980 may be disposed in the external pad bonding area PA. The common source line contact plug 980 may be formed of a conductive material such as a metal, a metal compound, polysilicon, or the like and may be electrically connected to the common source line 920. A first metal layer 950*a* and a second metal layer 960*a* may be sequentially stacked on an upper portion of the common source line contact plug 980. As an example, an area in which the common source line contact plug 980, the first metal layer 950*a*, and the second metal layer 960*a* are disposed may be defined as the external pad bonding area PA.

Input/output pads 805 and 905 may be disposed in the external pad bonding area PA. Referring to FIG. 26, a lower insulating film 801 covering a lower surface of the first substrate 810 may be formed below the first substrate 810 and a first input/output pad 805 may be formed on the lower insulating film 801. The first input-output pad 805 may be connected to at least one of the plurality of circuit elements 820*a*, 820*b*, and 820*c* disposed in the peripheral circuit region PERI through a first input/output contact plug 803 and may be separated from the first substrate 810 by the lower insulating film 801. In addition, a side insulating film may be disposed between the first input/output contact plug 803 and the first substrate 810 to electrically separate the first input/output contact plug 803 and the first substrate 810.

Referring to FIG. 26, an upper insulating film 901 may be formed on the second substrate 910 to cover the upper surface of the second substrate 910 and a second input/output pad 905 may be disposed on the upper insulating layer 901. The second input/output pad 905 may be connected to at least one of the plurality of circuit elements 820*a*, 820*b*, and 820*c* disposed in the peripheral circuit region PERI through a second input-output contact plug 903.

According to embodiments, the second substrate 910 and the common source line 920 may not be disposed in an area in which the second input-output contact plug 903 is disposed. Also, the second input-output pad 905 may not overlap the word lines 930 in the third direction (the Z-axis direction). Referring to FIG. 26, the second input/output contact plug 903 may be separated from the second substrate 910 in a direction, parallel to the upper surface of the second substrate 910, and may penetrate through the interlayer insulating layer 815 of the cell region CELL to be connected to the second input-output pad 905.

According to embodiments, the first input/output pad 805 and the second input/output pad 905 may be selectively formed. As an example, the memory device 1000 may include only the first input-output pad 805 disposed on the first substrate 810 or the second input/output pad 905 disposed on the second substrate 910. Alternatively, the memory device 1000 may include both the first input/output pad 805 and the second input/output pad 905.

A metal pattern provided on an uppermost metal layer may be provided as a dummy pattern or the uppermost metal layer may be absent, in each of the external pad bonding area PA and the bit line bonding area BLBA, respectively included in the cell region CELL and the peripheral circuit region PERI.

In the external pad bonding area PA, the memory device 1000 may include a lower metal pattern 973a, corresponding to an upper metal pattern 972a formed in an uppermost metal layer of the cell region CELL, and have the same cross-sectional shape as the upper metal pattern 972a of the cell region CELL so as to be connected to each other in an uppermost metal layer of the peripheral circuit region PERI. In the peripheral circuit region PERI, the lower metal pattern 973a formed in the uppermost metal layer of the peripheral circuit region PERI may not be connected to a contact. Similarly, in the external pad bonding area PA, an upper metal pattern 972a, corresponding to the lower metal pattern 973a formed in an uppermost metal layer of the peripheral circuit region PERI, may have the same shape as a lower metal pattern 973a of the peripheral circuit region PERI and may be formed in an uppermost metal layer of the cell region CELL.

The lower bonding metals 871b and 872b may be formed on the second metal layer 840b in the wordline bonding area WLBA. In the wordline bonding area WLBA, the lower bonding metals 871b and 872b of the peripheral circuit region PERI may be electrically connected to the upper bonding metals 971b and 972b of the cell region CELL by a bonding.

Further, in the bitline bonding area BLBA, an upper metal pattern 992, corresponding to a lower metal pattern 852 formed in the uppermost metal layer of the peripheral circuit region PERI, may have the same cross-sectional shape as the lower metal pattern 852 of the peripheral circuit region PERI and may be formed in an uppermost metal layer of the cell region CELL. A contact may not be formed on the upper metal pattern 992 formed in the uppermost metal layer of the cell region CELL.

As described above, according to an example embodiment, a memory controller may transmit a first read command and a second read command, different from each other, to a memory device. When correction of an error in read data obtained from the memory device using the first read command fails, the second read command may be transmitted to the memory device. When correction of the error in the read data obtained from the memory device using the second read command fails, a level of a read voltage may be adjusted using an offset voltage obtained by inputting information, obtained as a result of the second read command, to a machine learning model, and the first read command may be transmitted again to the memory device. Thus, an increase in time required for a read operation may be significantly reduced while securing reliability of the read operation. As a result, performance of the memory device and a storage device may be optimized.

As is traditional in the field, embodiments may be described and illustrated in terms of blocks which carry out a described function or functions. These blocks, which may be referred to herein as units or modules or the like, are physically implemented by analog and/or digital circuits such as logic gates, integrated circuits, microprocessors, microcontrollers, memory circuits, passive electronic components, active electronic components, optical components, hardwired circuits and the like, and may optionally be driven by firmware and/or software. The circuits may, for example, be embodied in one or more semiconductor chips, or on substrate supports such as printed circuit boards and the like. The circuits constituting a block may be implemented by dedicated hardware, or by a processor (e.g., one or more programmed microprocessors and associated circuitry), or by a combination of dedicated hardware to perform some functions of the block and a processor to perform other functions of the block. Each block of the embodiments may be physically separated into two or more interacting and discrete blocks without departing from the scope of the disclosure. Likewise, the blocks of the embodiments may be physically combined into more complex blocks without departing from the scope of the disclosure. An aspect of an embodiment may be achieved through instructions stored within a non-transitory storage medium and executed by a processor.

While example embodiments have been shown and described above, it will be apparent to those of ordinary skill in the art that modifications and variations could be made without departing from the scope of the present disclosure as defined by the appended claims.

What is claimed is:

1. A memory controller comprising:
control pins connected to at least one memory device and providing control signals to the memory device;
data pins connected to the memory device and configured to transmit and receive a data signal to and from the memory device;
a buffer memory configured to store a table, in which a static offset voltage for a read voltage is written, and a machine learning model receiving cell count information, indicating a threshold voltage valley of memory cells included in the memory device, and outputting a dynamic offset voltage for a read operation;
an error correction circuit configured to correct an error in read data obtained from the memory device; and
a processor configured to control the memory device to perform an optimal read operation obtaining read data by adjusting an operating condition of the read operation when the error correction circuit fails to correct the error in the read data, wherein
when the error correction circuit fails to correct an error in read data obtained by the optimal read operation, the processor obtains the dynamic offset voltage using the cell count information generated during the optimal read operation and transmits a corrected read voltage, reflecting the dynamic offset voltage, to the memory device.

2. The memory controller of claim 1, wherein:
each of the memory cells has at least one state, among a plurality of states, depending on written data, and
the cell count information includes the number of memory cells turned on or turned off depending on the operating condition of the read operation in each of the plurality of states.

3. The memory controller of claim 2, wherein the machine learning model receives at least one of an address of a selected memory cell, in which the read data is stored in the memory device, and degradation information of the selected memory cell, together with the cell count information and outputs the dynamic offset voltage.

4. The memory controller of claim 1, wherein the table includes a first table in which a first static offset voltage is written, a second table in which a second static offset voltage is written, and a third table in which a third static offset voltage, corresponding to a history read level and determined by the first static offset voltage and the second static offset voltage, is written.

5. The memory controller of claim 4, wherein:
the optimal read operation includes an on-chip valley search operation, and
the processor receives detection information of the on-chip valley search operation together with read data generated in the optimal read operation.

6. The memory controller of claim 5, wherein:
the detection information includes the cell count information and a detection case determined based on the cell count information, and
the second static offset voltage is matched with the detection case and written in the second table.

7. The memory controller of claim 6, wherein the processor determines the second static offset voltage based on the detection case and the second table and updates the third table using the second static offset voltage, when the error correction circuit successfully corrects an error in the read data generated in the optimal read operation.

8. The memory controller of claim 4, wherein the processor determines a default level of the read voltage based on the third table when a read command for the memory device is generated.

9. The memory controller of claim 4, wherein the processor updates the third table using the dynamic offset voltage when an error in read data, generated in a read operation performed using the corrected read voltage by the memory device, is corrected by the error correction circuit.

10. The memory controller of claim 1, wherein:
the processor generates a first read command and a second read command different from the first read command,
the first read command controls the memory device to perform a read operation based on a level of a read voltage determined by the processor, and
the second read command controls the memory device to perform the optimal read operation using an on-chip valley search operation.

11. The memory controller of claim 10, wherein the processor transmits the second read command to the memory device when an error in the read data obtained by the first read command is not corrected.

12. The memory controller of claim 11, wherein the processor transmits the first read command, including the corrected read voltage, to the memory device when an error in the read data is obtained by the second read command.

13. A storage device comprising:
at least one memory device; and
a memory controller configured to store a table, in which a static offset voltage for a read voltage is written, and a machine learning model determining a dynamic offset voltage for a read voltage, wherein the memory controller is connected to the memory device by:
control pins providing at least one of a command latch enable (CLE) signal, an address latch enable (ALE) signal, a chip enable (CE) signal, a read enable (RE) signal, and a DQS signal, and
data pins transmitting and receiving a data signal to and from the memory device, wherein:
when an error in first read data, output by the memory device performing a first read operation, is not corrected, the memory controller controls the memory device to perform a second read operation including an on-chip valley search operation, and
when an error in a second read voltage, output by the memory device performing a second read operation, is not corrected, the memory controller transmits to the machine learning model a corrected read voltage reflecting a dynamic offset voltage obtained by inputting at least a portion of detection information generated by the on-chip valley search operation.

14. The storage device of claim 13, wherein the memory device includes memory cells and each of the memory cells stores two or more bits of data and has one of a plurality of states determined by the data.

15. The storage device of claim 14, wherein detection information of the on-chip valley search operation includes cell count information, indicating the number of memory cells determined to be turned on or turned off by a level of the read voltage in each of the plurality of states, and a detection case selected from the cell count information to determine a development time of the second read operation.

16. The storage device of claim 13, wherein the memory device outputs second read data, obtained by performing the first read operation using the corrected read voltage, to the memory controller.

17. A memory device comprising:
an input/output interface including a plurality of control pins, receiving control signals from a memory controller, and a plurality of data pins, transmitting and receiving a data signal to and from the memory controller, and configured to receive at least one of a first read command and a second read command from the memory controller;
a memory cell array having a plurality of memory cells; and
a logic circuit configured to output read data, obtained from selected memory cells among the plurality of memory cells, to the memory controller in response to the first read command and the second read command, wherein:
the logic circuit outputs cell count information, indicating a threshold voltage distribution of a plurality of states that the memory cells have, and a detection case, determined based on the cell count information, to the memory controller when receiving the second read command, and
when the first read command for the selected memory cells is re-received from the memory controller after the cell count information is output, a read operation is performed using a read voltage included in the re-received first read command and the read data is output to the memory controller.

18. The memory device of claim 17, wherein the logic circuit outputs the cell count information, ahead of the read data, to the memory controller in response to the second read command.

19. The memory device of claim 17, wherein the logic circuit includes an OVS circuit configured to generate the cell count information in response to the second read command and to perform an on-chip valley search operation determining the detection case.

20. The memory device of claim 19, wherein the OVS circuit performs the on-chip valley search operation on all of the plurality of states.

* * * * *